US008535872B2

(12) United States Patent
De et al.

(10) Patent No.: US 8,535,872 B2
(45) Date of Patent: Sep. 17, 2013

(54) THERMALLY CURED UNDERLAYER FOR LITHOGRAPHIC APPLICATION

(75) Inventors: Binod B. De, Attleboro, MA (US); Ognian N. Dimov, Warwick, RI (US); Stephanie J. Dilocker, East Providence, RI (US)

(73) Assignee: Fujifilm Electronic Materials, U.S.A., Inc., North Kingstown, RI (US)

( * ) Notice: Subject to any disclaimer, the term of this patent is extended or adjusted under 35 U.S.C. 154(b) by 0 days.

(21) Appl. No.: 13/426,194

(22) Filed: Mar. 21, 2012

(65) Prior Publication Data

US 2012/0178871 A1 Jul. 12, 2012

Related U.S. Application Data

(63) Continuation of application No. 12/033,923, filed on Feb. 20, 2008, now Pat. No. 8,153,346.

(60) Provisional application No. 60/902,991, filed on Feb. 23, 2007.

(51) Int. Cl.
*G03F 7/004* (2006.01)
*G03F 7/028* (2006.01)

(52) U.S. Cl.
USPC ......................... 430/270.1; 430/910; 430/927

(58) Field of Classification Search
USPC .................... 430/270.1, 271.1, 907, 910, 927
See application file for complete search history.

(56) References Cited

U.S. PATENT DOCUMENTS 5,488,182 A 1/1996 Kobayashi et al.
5,525,453 A 6/1996 Przybilla et al.
5,650,261 A 7/1997 Winkle
5,658,706 A 8/1997 Niki et al.
5,783,354 A 7/1998 Schwalm et al.
5,948,589 A 9/1999 Sato et al.
6,114,085 A 9/2000 Padmanaban et al.
6,251,569 B1 6/2001 Angelopoulos et al.
6,479,210 B2 11/2002 Kinoshita et al.
6,509,134 B2 1/2003 Ito et al.
6,514,663 B1 2/2003 Hien et al.
6,677,419 B1 1/2004 Brock et al.
6,703,181 B1 3/2004 Hayashi et al.
6,749,989 B2 6/2004 Hada et al.
6,830,870 B2 12/2004 Malik et al.
6,958,205 B2 10/2005 Iwato et al.
7,160,667 B2 1/2007 Iwato
7,482,107 B2 1/2009 Thackeray et al.
7,514,204 B2 4/2009 Hatakeyama et al.
7,598,016 B2 10/2009 Kobayashi et al.
8,153,346 B2 * 4/2012 De et al. .................... 430/271.1
2002/0007018 A1 1/2002 Foster et al.
2002/0028409 A1 3/2002 Yasunami et al.
2002/0040115 A1 4/2002 Sen et al.
2002/0058204 A1 5/2002 Khojasteh et al.
2002/0076642 A1 * 6/2002 Zampini et al. ............ 430/270.1
2002/0102483 A1 8/2002 Adams et al.
2002/0102490 A1 8/2002 Ito et al.
2002/0128408 A1 9/2002 Goodall et al.
2003/0059522 A1 3/2003 Mutz et al.
2004/0048194 A1 3/2004 Breyta et al.
2004/0167298 A1 8/2004 Yamagishi et al.
2004/0242798 A1 12/2004 Sounik et al.
2005/0215713 A1 9/2005 Hessell et al.
2005/0238997 A1 10/2005 De et al.
2006/0166130 A1 7/2006 Ogata et al.
2008/0241736 A1 10/2008 Kobayashi et al.

OTHER PUBLICATIONS

Nalamasu, Omkaram et al., "Preliminary Lithographic Characteristics of an All-organic Chemically Amplified Resist Formulation for Single Layer Deep-UV Lithography," SPIE, vol. 1466 Advances in Resist Technology and Processing VIII (1991), 13 pgs.
Non-final Office Action from U.S. Appl. No. 12/033,923 mailed Feb. 17, 2011, 12 pgs.
Non-final Office Action from U.S. Appl. No. 12/033,923 mailed Jun. 28, 2011, 12 pgs.

* cited by examiner

*Primary Examiner* — Anca Eoff
(74) *Attorney, Agent, or Firm* — Blakely, Sokoloff, Taylor & Zafman LLP

(57) ABSTRACT

An etch resistant thermally curable Underlayer composition for use in a multiplayer lithographic process for producing a photolithographic bilayer coated substrate, the composition being a composition of:

(a) a polymer comprising repeating units of Structure I, II and III

I

X, Y, m, $R^1$, $R^2$, $R^3$, $R^4$

II $R^{14}$, A, $(R^{15})_r$, $(OH)_q$

III $R^{21}$, L—M—(E—$R^{22}$)$_t$ (b) at least one crosslinking agent;
(c) at least one thermal acid generator; and
(d) at least one solvent.

9 Claims, No Drawings

THERMALLY CURED UNDERLAYER FOR LITHOGRAPHIC APPLICATION

RELATED APPLICATIONS

This application is a continuation of U.S. patent application Ser. No. 12/033,923, filed Feb. 20, 2008, which claims priority from U.S. Provisional Patent Application No. 60/902,991, filed Feb. 23, 2007, the entire contents of which are hereby incorporated by reference herein.

FIELD OF THE DISCLOSURE

The present disclosure relates to bilayer lithography used in the manufacture of semiconductor devices and more particularly to high etch resistant underlayer compositions for chemically amplified bilayer resist systems.

BACKGROUND OF THE DISCLOSURE

Microelectronic industries, as well as other related industries are constantly reducing the feature size for constructing microscopic structures. Effective lithographic techniques are essential in this quest and require constantly improved radiation sensitive materials (resists). In order to resolve smaller structures, the wavelength of the exposing light has been reduced into the deep UV regions of 248 nm, 193 nm and 157 nm in addition to exposure to EUV or x-ray radiation. As the patterns and wavelengths become finer, the material properties of the resists used for pattern delineation have become more and more demanding. In particular, requirements of sensitivity, transparency, aesthetics of the image produced, and the selectivity of the resists to etch conditions for pattern transfer become more and more strenuous.

Advanced resists usually employ a technique called chemical amplification in which an acid generated by photolysis catalyzes a solubility switch from alkali insoluble to alkali soluble by removal of an acid sensitive (acid cleavable) group protecting an alkali-solubilizing moiety. The principle of chemical amplification as a basis for resist operation has been known for some years (see U.S. Pat. No. 4,491,628). Most chemically amplified resists have been designed around the use of acid sensitive carboxylic esters or acid sensitive hydroxystyrene derivatives.

However, chemically amplified resist systems have many shortcomings. One problem is standing wave effects, which occur when monochromatic light is reflected off the surface of a reflective substrate during exposure. These standing waves are variations of light intensity in the photoresist film dependent on photoresist film thickness caused by constructive and destructive interference of monochromatic light due to reflection. This in turn reduces resolution and causes line width variations. These line width changes are particularly troublesome for ever-shrinking features. For example, standing waves in a positive photoresist have a tendency to result in footing at the photoresist/substrate interface reducing the resolution of the photoresist. CD variations can be controlled by tightly controlling the photoresist thickness variation. However, this is difficult to do when the photoresist has to cover steps in the substrate topography. Patterning over substrate topography can also cause localized reflections, which result in areas of the photoresist to be over or underexposed. This reflective notching results in localized line width variations.

In addition, chemically amplified resist profiles and resolution may change due to substrate poisoning. This effect occurs, particularly, when the substrate has a nitride layer. It is believed that residual N—H bonds in the nitride film deactivate the acid at the nitride/resist interface. For a positive resist, this results in an insoluble area, and either resist scumming, or a foot at the resist/substrate interface.

Furthermore, limitations of lithographic aspect ratios require the chemically amplified resist layer be thin, e.g., about 500 nm or lower, to print sub 180 nm features. This in turn requires the resist to have excellent plasma etch resistance such that resist image features can be transferred down into the underlying substrate. However, in order to decrease absorbance of the chemically amplified photoresists, aromatic groups, such as those in novolaks had to be removed, which in turn decreased the etch resistance.

The most common type of resists are called "single layer" resists (SLR). These resists utilize highly absorbing thin anti-reflective coatings (ARCs) to minimize standing wave effects. These anti-reflective coatings also mitigate problems with substrate poisoning if they are applied between the substrate and the photoresist.

In SLR systems a resist has the dual function of imaging and providing plasma etch resistance. Therefore, distinct performance tradeoffs have to be made between lithographic properties of the resist like absorbance, image profiles, resolution and substrate plasma etch resistance. For example in a typical dielectric mask open the resist is required to withstand an oxygen plasma etch to open up the ARC layer and a subsequent substrate etch. A significant amount of photoresist is lost during the ARC etch process as the etch selectivity between resist and ARC is only about 1:1. This requires the ARC to be as thin as possible to retain a sufficient photoresist film thickness for the substrate etch. Therefore, these ARCs must have relatively high absorbance (k-values) at the actinic wavelength in order to be effective in preventing substrate reflection.

Another approach is the utilization of a bilayer resist (BLR) system. A BLR system consists of a substrate coated with a first thick layer of underlayer (UL) film followed by a second thin layer of dried resist (imaging layer or IL). The underlayer film is etched in an oxygen rich plasma environment with the IL functioning as the etch mask. The typical imaging layer consists of a dried, chemically amplified, silicon containing resist. The silicon in the IL converts to a silicon oxide moiety during the oxygen plasma etch of the UL, thus giving the IL the needed etch selectivity to the UL. The underlayer film then acts as an etch resistant mask for substrate etching using non-oxygen or low-oxygen plasma etch chemistries, for removal of the underlying substrate.

Similar to the ARC in SLR, the underlayer film in BLR should be optimally designed to absorb most of the deep UV light, which attenuates standing wave effects. In addition, the underlayer film prevents deactivation of the acid catalyst at the resist/substrate interface. However, in the BLR system it is the underlayer film that is the primarily etch mask for the substrate etch. Hence, underlayer films incorporate polymers with functional groups to provide etch selectivity. The resist doesn't have the dual function to provide imaging and plasma etch resistance. Thus the resist can be thin compared to the SLR system and its lithographic properties do not have to be compromised. In addition, the underlayer composition is applied to the substrate to produce an underlayer film at about 2 to 5 times the thickness of a typical ARC layer. This helps substantially in planarizing the substrate prior to the next imaging step. Therefore the above mentioned reflectivity problems due to substrate topography as well as resist thickness uniformity problems have been improved.

Even though the underlayer film attenuates standing waves and substrate poisoning, it poses other problems. First, some underlayers are soluble to the chemical amplified resist solvent component. If there is intermixing between the resist when applied and the underlayer, the resolution and sensitivity of the imaging layer will be detrimentally affected.

The refractive index (N) is a complex number, N=n−ik, where n is the "real" part of the refractive index, and ik the imaginary part of the refractive index. k, the extinction coefficient, is proportional to the absorption coefficient (α), which is a function of the wavelength (λ), and can be approximated by the following relationship $k=\lambda\alpha/(4\pi)$. If there is a large difference in the index of refraction between the chemically amplified resist and the underlayer film, light will reflect off the underlayer film which causes standing wave effects in the resist. Thus, the real portion "n" of the index of refraction of the two layers must be made to essentially match or to have their differences minimized, and the imaginary portion "k" of the index of refraction of the two layers must be optimized to minimize reflectivity effects. This optimization is important to minimize residual reflectivity from the UL/IL interface. Thus, when selecting the appropriate k-value a trade-off must be made between suppression of substrate reflectivity and reflectivity from the UL/IL interface. k-values in the UL can be low compared to ARCs because ULs are employed at a much higher film thickness. This results in low UL/IL interface reflectivity. ARCs on the other hand need to be thin because of poor etch selectivity to the photoresist and in order to control substrate reflectivity they need to be highly absorbing.

Another problem with underlayers is that they are sometimes too absorbent because of incorporation of aromatic groups. Some semiconductor manufacturing deep UV exposure tools utilize the same wavelength of light to both expose the photoresist and to align the exposure mask to the layer below the resist. If the underlayer is too absorbent, the reflected light needed for alignment is too attenuated to be useful. In addition, it is possible for the composition to be "too absorbing", which can result in a higher level of reflection than with an optimized absorbance based on refractive index matching and optimized absorbance. However, if the underlayer is not absorbent enough, standing waves may occur. A formulator must balance these competing objectives.

In addition, the underlayer film must be compatible with at least one edge bead remover acceptable to the semiconductor industry as well as give excellent compatibility with the resist coated over the underlayer film so that lithographic performance (e.g. photospeed, wall profiles, depth of focus, adhesion) are not adversely impacted.

Furthermore, some underlayers require UV exposure in order to form crosslinks before the radiation sensitive resist can be applied to form the imaging layer. The problem with UV crosslinkable underlayers is that they require long exposure times to form sufficient crosslinks. The long exposure times severely constrain throughput and add to the cost of producing integrated circuits. The UV tools also do not provide uniform exposure so that some areas of the underlayer may be crosslinked more than other areas of the underlayer. In addition, UV crosslinking exposure tools are very expensive and are not included in most resist coating tools because of expense and space limitations.

Some underlayers are crosslinked by heating. However, the problem with some of these underlayers is that they require high curing temperatures and long curing times before the resist for the imaging layer can be applied. In order to be commercially useful, underlayers should be curable at temperatures below 250° C. and for a time less than 180 seconds. After curing, the underlayer film should have a high glass transition temperature to withstand subsequent high temperature processing and not intermix with the resist layer.

Even at temperatures below 250° C. sublimation of small amounts of the underlayer film components (e.g. TAGs, oligomers from the polymer) or products from the thermal curing (e.g. acids, alcohols, water) frequently occur. This can result in increased equipment downtime due to contamination requiring more frequent cleaning and replacement of equipment parts.

In certain applications, it is desirable for the underlayer film to planarize the surface of the substrate. However, this may be difficult to accomplish with underlayer films undergoing thermal crosslinking. As the temperature rises and the number of crosslinks increases, the glass transition temperature of the film increases. This makes it more difficult for the film to flow and planarize the substrate. Thus it is desirable to use as low a molecular weight material as possible to improve the planarization. However, use of lower molecular weight polymers in the underlayer film can adversely impact the lithographic performance of the resist imaging process.

In addition to the requirements for no intermixing, no sublimation, EBR compatibility, good planarization properties, and optical properties appropriately complementing the resist coated over the underlayer film, underlayer films need to have good etch resistance to allow the pattern transfer into the underlying substrate. While novolak or p-hydroxystyrene (PHS) based polymers show good etch resistance to various plasma sources, these materials absorb very strongly at 193 nm and their k(λ=193 nm) value is as high as 0.64. (Proc SPIE 2001, 4345, p 50 and EP Patent No. 0542008). Conversely, acrylate-based polymers possess good optical transparency at 193 nm but suffer from poor etch resistance. Solutions for these issues individually frequently adversely impact the performance in other areas. U.S. Pat. No. 6,610,808 (De et al.) describes a polymer for use in an underlayer film in a BLR system incorporating polar groups to improve EBR compatibility. US Patent application 2005/0238997 (De et al.) describes a polymer system with decreased sublimation tendencies and an optimized molecular weight (MW) range for the same use. However, these acrylic based underlayer films need improved plasma etch resistance for certain applications.

Cycloolefin polymers offer better transparency at 193 nm compared to novolaks and PHS-based materials. U.S. Pat. No. 6,136,499 discloses that cycloolefin polymer systems exhibit etch resistance superior to even some aromatic systems. Therefore, incorporation of cycloolefin monomeric units into styrenic or acrylic polymers, or styrenic/acrylic co-polymers may have some advantage. However, due to the rigidity of the cycloolefin monomers, the Tg may increase, which adversely affects the ability of the polymer to planarize the substrate topography. In addition, the cycloolefin monomers exhibit low reactivity to free radical polymerization conditions.

A low amount of a cycloolefin monomer can be incorporated into the matrix of a final polymer in copolymerization with acrylic or styrenic monomers under free radical conditions (see example U.S. Pat. No. 3,697,490). The copolymerization of cycloolefin and acrylic or styrenic monomers is very effective using transition metal catalyst(s) (i.e. co-ordination catalyst) with or without Lewis acid promoters. Such copolymerization procedures are described, for example, in U.S. Pat. Nos. 3,723,399, 6,111,041, 6,136,499, 6,300,440, and 6,303,724. Metal contamination of the polymer is one major problem with this type of polymerization. Thus, expensive and lengthy metal removal processes must be used if the polymer is to be used in microelectronic materials. Alternatively, copolymers of cycloolefins with monomers containing two electron-withdrawing groups appended to the polymerizable double bond, such as maleic acid and its esters, can be obtained easily by free radical initiation methods. Examples are illustrated in U.S. Pat. No. 6,303,265. However, the copolymerization of cycloolefins with monomers containing only one electron-withdrawing group appended to the polymerizable double bond have been reported only very limited and are discussed below.

The present disclosure is directed to thermally curable Underlayer compositions using polymers prepared by free radical initiation methods from mixtures comprising cycloolefinic, substituted vinyl aromatic, and selected property enhancing monomers. These polymers, when used in the Underlayer composition, improve etch resistance and improve substrate planarization of the Underlayer film. Lower molecular weight polymers may be employed without major adverse impacts in other performance areas. It is, however, not obvious how to prepare and combine these materials as an Underlayer film and obtain all of the required properties of an Underlayer film at the same time.

SUMMARY OF THE DISCLOSURE

The object of the present disclosure is to provide a high etch resistant thermally curable Underlayer composition for multilayer lithographic processes such as a bilayer resist systems. Underlayer compositions are used to manufacture Underlayer films that function simultaneously as antireflection layers and planarization layers to facilitate the lithography of the imaging layer and also act as a protective etch mask for pattern transfer into the underlying substrate.

In one aspect, the present disclosure is directed to a novel high etch resistant thermally curable Underlayer composition comprising (A) a polymer comprising repeating units of Structure I, II and III

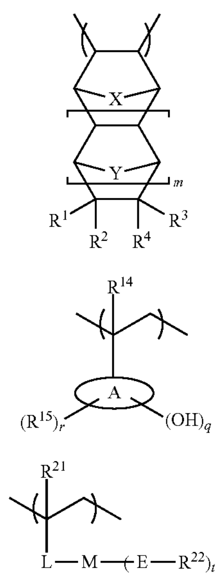

wherein $R^1$, $R^2$, $R^3$ and $R^4$ individually represent a hydrogen atom, a halogen atom, a linear, branched or cyclic $C_1$-$C_{10}$ alkyl group, a $C_6$-$C_{20}$ aryl group, a halogenated or partially halogenated linear, branched or cyclic $C_1$-$C_{10}$ alkyl group, or a polar group represented by $(CH_2)_nR^5$ wherein $R^5$ represents —$OR^6$, —$(OR^{12})_oOR^7$, —$C(O)OR^8$, —$C(O)(OR^{12})_oOR^9$ or —$OC(O)R^{10}$ and n is an integer from 0 to 5; wherein $R^6$, $R^7$, $R^8$, $R^9$ and $R^{10}$ each independently represent a hydrogen atom, a substituted or unsubstituted linear, branched or cyclic $C_1$-$C_{20}$ alkyl group or a substituted or unsubstituted $C_6$-$C_{20}$ aryl group; $R^{12}$ is a $C_2$-$C_6$ linear, branched or cyclic alkylene group; o is an integer from 1 to about 5; $R^2$ and $R^4$ may be bonded to each other to form a bivalent group represented by —C(O)—Z—C(O)— or —$(CH_2)_pOC(O)$—, wherein Z is —O— or —$N(R^{13})$— and p is an integer from 1 to about 3; wherein $R^{13}$ represents a hydrogen atom or a $C_1$-$C_{10}$ alkyl group; m is an integer from 0 to about 4; and X and Y are independently —$CH_2$—, —O—, or —S—; $R^{14}$ is a hydrogen atom, a $C_1$-$C_3$ alkyl group, a fully or partially halogen substituted $C_1$-$C_3$ alkyl group, or a halogen atom; A represents a $C_6$-$C_{20}$ arylene group or an $A^1$-W-$A^2$ group wherein $A^1$ is a $C_6$-$C_{10}$ arylene group, $A^2$ is a $C_6$-$C_{10}$ aryl group and W is selected from the group of a single bond, —S—, —O—, —C(O)—, —C(O)O—, —$C(R^{16}R^{17})$—, —$C(=CR^{18}R^{19})$— and —$CR^{18}=CR^{19}$—, wherein $R^{16}$, $R^{17}$, $R^{18}$ and $R^{19}$ are independently a hydrogen atom, a halogen atom, a cyano group or a $C_1$-$C_{10}$ alkyl group or a partial or complete halogen substituted $C_1$-$C_{10}$ alkyl group; $R^{15}$ is a halogen atom, a linear, branched or cyclic $C_1$-$C_{10}$ alkyl group, or a partial or complete halogen substituted $C_1$-$C_{10}$ alkyl group; q is an integer from 1 to 2; and r is an integer from 0 to about 3; $R^{21}$ is a hydrogen atom, a $C_1$-$C_3$ alkyl group, a fully or partially halogen substituted $C_1$-$C_3$ alkyl group, or a halogen atom; L represents a single bond, a —C(O)O—, —$C(O)O(R^{23}O)_s$— or a —$C(O)NR^{24}$— group, wherein $R^{23}$ represents a $C_2$-$C_6$ alkylene group; $R^{24}$ represents a hydrogen atom or a linear, branched or cyclic $C_1$-$C_{10}$ alkyl group; and s is an integer from 1 to about 4; M represents a $C_5$-$C_{20}$ cycloalkylene group or a $C_6$-$C_{18}$ arylene group; E represents a single bond, —O—, —C(O)O—, —C(O)—, or —$S(O_2)$—; $R^{22}$ represents a hydrogen atom, a substituted or unsubstituted linear, branched or cyclic $C_1$-$C_{10}$ alkyl group, alicyclic $C_5$-$C_{15}$ hydrocarbon group, a $C_6$-$C_{18}$ aryl group or a $C_7$-$C_{18}$ alkylaryl group and t is an integer from 1 to about 4; with the proviso that when L is a single bond and M is an arylene group E-$R^{22}$ is not —OH; and with the proviso that none of the repeating units of Structure I or II or III contain acid sensitive groups;

(B) at least one crosslinking agent;

(C) at least one thermal acid generator; and (D) at least one solvent.

The present disclosure also relates to a photolithographic bilayer coated substrate comprising: a substrate, a film of the thermally cured Underlayer composition (Underlayer film) as described above coated on the substrate and a radiation-sensitive chemically amplified resist coated over the thermally cured Underlayer composition.

The disclosure further relates to a process for forming a pattern on a substrate which comprises the following process steps:

(a) providing a substrate;

(b) coating in a first coating step said substrate with a thermally curable Underlayer composition of this disclosure;

(c) curing said Underlayer composition to provide an Underlayer film;

(d) coating in a second coating step a silicon containing radiation sensitive resist over the Underlayer film to produce a bilayer resist stack;

(e) baking the silicon containing radiation sensitive resist in a second baking step;

(f) exposing the bilayer resist stack;

(g) developing a portion of the silicon containing radiation sensitive resist of the bilayer resist stack and uncovering a portion of the underlying Underlayer film;

(h) rinsing the bilayer resist stack; and (i) etching the uncovered Underlayer film in oxidizing plasma to produce a bilayer relief image.

DETAILED DESCRIPTION AND EMBODIMENTS

It is an object of this disclosure to obtain a thermally curable Underlayer composition to be used as an Underlayer film in lithographic processes with low sublimation tendencies, good planarization capabilities and high etch selectivity that is compatible with high performance lithographic imaging and has high formulation latitude. In addition this thermally curable Underlayer composition needs to be compatible with solvents employed in commercial edge bead remover compositions.

The term 'acid sensitive group' is defined to mean a functional group which reacts more than 5 molar % in the presence of an acid such as carboxylic or sulfonic acid under bake conditions of up to 160° C. for a duration of up to 10 minutes to yield a new functional group that increases the polymer's solubility in aqueous alkali developer solutions.

The term 'cyclic alkyl' is intended to include simple, unsaturated alkyl rings as well as, polycyclic and bridged alkyl structures.

The term 'cyclic alkylene' is intended to include simple, unsaturated alkylene rings as well as, polycyclic and bridged alkylene structures.

The term 'significant crosslinking' is defined as an increase in the glass transition temperature by about 5% or more.

The thermally curable Underlayer composition comprises a polymer comprising cycloolefinic, substituted vinyl aromatic, and selected property enhancing monomeric units, a crosslinking agent, a thermal acid generator (TAG), and a solvent. When the composition is cast as a film and is heated, the thermal acid generator produces an acid that catalyzes the crosslinking reaction of the polymer with the crosslinker. After sufficient crosslinking, the Underlayer film becomes insoluble in the resist coating solvent.

Thermal acid generators are preferred for this Underlayer composition, although free acids could be used. However, free acids may shorten the shelf life of the Underlayer composition if the polymer crosslinks over time in solution. Conversely thermal acid generators are only activated when the Underlayer film is heated. Even though the Underlayer composition may comprise a polymer and crosslinking agent capable of crosslinking the polymer upon heating without a TAG, the addition of the thermal acid generator is preferred for enhanced crosslinking efficiency.

It is critical to the lithographic performance of the BLR system that the Underlayer film minimizes reflective interference effects from both the substrate and the Underlayer film/imaging layer interface. This is accomplished by carefully tuning the optical properties of the Underlayer film to the imaging layer (IL). Both the "real" portion of the refractive index (n) and the "imaginary" portion of the refraction index (ik) are important. k is proportional to the absorption of the material. A polymer needs sufficiently high optical absorbance to prevent light to reflect back from the substrate into the imaging layer interface. The polymer also needs to have a matched refractive index n with the imaging layer in order to prevent light reflection from the Underlayer film/imaging layer. If the UL and IL have a closely matched n, the reflection of light from the Underlayer film is then in approximation proportional to $k^2$ of the Underlayer film. (See Neisser et al, Proc. SPIE 2000, 4000, p 942-951 and U.S. Pat. Nos. 6,042,992 and 6,274,295). Thus, reducing k by a factor of two will reduce the reflectivity of the UL/IL interface by a factor of four. It is therefore possible for the composition to be "too absorbing". The "imaginary" portion "k" of the index of refraction of the two layers must be optimized to minimize reflectivity effects from both, a reflecting substrate and the Underlayer film. Typically, Underlayer films have lower k-values than ARCs, but still provide low substrate reflectivity simply because they are coated at higher film thicknesses. These lower k values provide better suppression of light reflected from the UL/IL interface back into the IL. In addition, higher coating thicknesses of the Underlayer film compared to ARCs minimize variations in substrate reflectivity due to film thickness non-uniformity of the Underlayer film and also reduce variation in imaging layer thickness non-uniformity due to superior planarization. All of this minimizes the interference effects from the actinic light into the imaging layer and results in more stable lithographic processes.

The ability of the Underlayer composition to planarize the underlaying substrate is another important property for certain applications. In order for the Underlayer composition to exhibit good planarizing ability it must be able to flow upon coating onto the substrate and during baking and fill spaces left by topography before the polymer in the Underlayer composition crosslinks significantly. To accomplish this, the polymer for the Underlayer composition should have optimized molecular weight and Glass Transition Temperature (Tg). Generally, the Tg of the polymer will increase with the Mw of the polymer. The polymer Tg needs to be low enough to allow the polymer to flow during the baking step at a temperature that does not promote significant crosslinking of the polymer. On the other hand if the Mw and Tg of the polymer are too low the Underlayer film will loose its substrate etch selectivity. Incorporation of monomeric units into the polymer that provide flexibility to the polymer chain will also aid planarization. In addition, the selection of the TAG and crosslinking agent is also important in this context. For example, if the thermal acid generator produces a significant amount of acid only at temperatures well above the Tg of the polymer, the Underlayer film will be able to flow before the heating process reaches the curing temperature.

Plasma and/or reactive ion etch (RIE) resistance is another critical parameter for the Underlayer film in bilayer applications in order to ensure efficient pattern transfer of the resist into the appropriate substrate. The proper absorptivity and substrate etch selectivity as well as degree of planarization of the Underlayer films produced from the Underlayer compositions of the present disclosure are obtained by carefully balancing the amounts and choice of the three base monomeric units (Structures I, II, and III).

In one embodiment, the present disclosure is directed to a novel thermally curable Underlayer composition with high etch resistance and good planarization properties comprising:

(A) a polymer comprising repeating units of Structure I, II and III

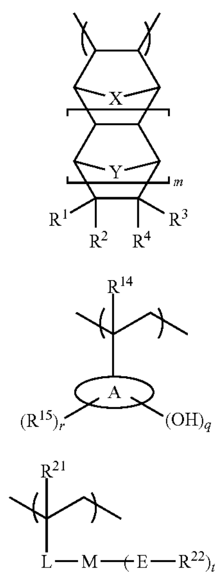

wherein $R^1$, $R^2$, $R^3$ and $R^4$ individually represent a hydrogen atom, a halogen atom, a linear, branched or cyclic $C_1$-$C_{10}$ alkyl group, a $C_6$-$C_{20}$ aryl group, a halogenated or partially halogenated linear, branched or cyclic $C_1$-$C_{10}$ alkyl group, or a polar group represented by $(CH_2)_nR^5$ wherein $R^5$ represents —$OR^6$, —$(OR^{12})_o OR^7$, —$CO)OR^8$, —$C(O)(OR^{12})_o OR^9$ or —$OC(O)R^{19}$ and n is an integer from 0 to 5; wherein $R^6$, $R^7$, $R^8$, $R^9$ and $R^{10}$ each independently represent a hydrogen atom, a substituted or unsubstituted linear, branched or cyclic $C_1$-$C_{20}$ alkyl group or a substituted or unsubstituted $C_6$-$C_{20}$ aryl group; $R^{12}$ is a $C_2$-$C_6$ linear, branched or cyclic alkylene group; o is an integer from 1 to about 5; $R^2$ and $R^4$ may be bonded to each other to form a bivalent group represented by —C(O)—Z—C(O)— or —$(CH_2)_pOC(O)$—, wherein Z is —O— or —$N(R^{13})$— and p is an integer from 1 to about 3; wherein $R^{13}$ represents a hydrogen atom or a $C_1$-$C_{10}$ alkyl group; m is an integer from 0 to about 4; and X and Y are independently —$CH_2$—, —O— or —S—; $R^{14}$ is a hydrogen atom, a $C_1$-$C_3$ alkyl group, a fully or partially halogen substituted $C_1$-$C_3$ alkyl group, or a halogen atom; A represents a $C_6$-$C_{20}$ arylene group or an $A^1$-W-$A^2$ group wherein $A^1$ is a $C_6$-$C_{10}$ arylene group, $A^2$ is a $C_6$-$C_{10}$ aryl group and W is selected from the group of a single bond, —S—, —O—, —C(O)—, —C(O)O—, —$C(R^{16}R^{17})$—. —$C(=CR^{18}R^{19})$— and —$CR^{18}=CR^{19})$— and wherein $R^{16}$, $R^{17}$, $R^{18}$ and $R^{19}$ are independently a hydrogen atom, a halogen atom, a cyano group or a $C_1$-$C_{10}$ alkyl group or a partial or complete halogen substituted $C_1$-$C_{10}$ alkyl group; $R^{15}$ is a halogen atom, a linear, branched or cyclic $C_1$-$C_{10}$ alkyl group, or a partial or complete halogen substituted $C_1$-$C_{10}$ alkyl group; q is an integer from 1 to 2; and r is an integer from 0 to about 3; $R^{21}$ is a hydrogen atom, a $C_1$-$C_3$ alkyl group, a fully or partially halogen substituted $C_1$-$C_3$ alkyl group, or a halogen atom; L represents a single bond, a —C(O)O—, —$C(O)O(R^{23}O)_s$— or a —$C(O)NR^{24}$— group, wherein $R^{23}$ represents a $C_2$-$C_6$ alkylene group; $R^{24}$ represents a hydrogen atom or a linear, branched or cyclic $C_1$-$C_{10}$ alkyl group; and s is an integer from 1 to about 4; M represents a $C_5$-$C_{20}$ cycloalkylene group or a $C_6$-$C_{18}$ arylene group; E represents a single bond, —O—, —C(O)O—, —C(O)—, or —$S(O_2)$—; $R^{22}$ represents a hydrogen atom, a substituted or unsubstituted linear, branched or cyclic $C_1$-$C_{10}$ alkyl group, alicyclic $C_5$-$C_{15}$ hydrocarbon group, a $C_6$-$C_{18}$ aryl group or a $C_7$-$C_{18}$ alkylaryl group and t is an integer from 1 to about 4; with the proviso that when L is a single bond and M is an arylene group E-$R^{22}$ is not —OH; and with the proviso that none of the repeating units of Structure I or II or III contain acid sensitive groups;

(B) at least one crosslinking agent;

(C) at least one thermal acid generator; and (D) at least one solvent.

When the Underlayer composition is heated, the thermal acid generator creates an acid that protonates the polyfunctional crosslinking agent resulting in a very strong electrophilic group. This group may react with a hydroxyl group on the hydroxyl-containing polymer to form the first link of a cured crosslinked polymer matrix. Polymers with hydroxyphenyl groups may also react by electrophilic substitution on the phenyl ring.

The polymer used in the present disclosure comprises a repeating unit represented by Structure I

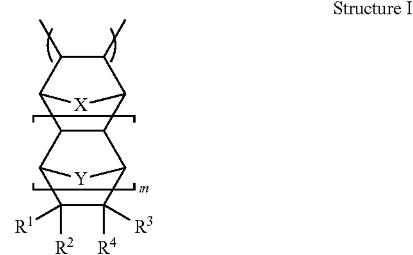

wherein $R^1$, $R^2$, $R^3$ and $R^4$ individually represent a hydrogen atom, a halogen atom, a linear, branched or cyclic $C_1$-$C_{10}$ alkyl group, a $C_6$-$C_{20}$ aryl group, a halogenated or partially halogenated linear, branched or cyclic $C_1$-$C_{10}$ alkyl group, or a polar group represented by $(CH_2)_nR^5$ wherein $R^5$ represents —$OR^6$, —$(OR^{12})_o OR^7$, —$C(O)OR^8$, —$C(O)(OR^{12})_o OR^9$ or —$OC(O)R^{19}$ and n is an integer from 0 to 5; wherein $R^6$, $R^7$, $R^8$, $R^9$ and $R^{10}$ each independently represent a hydrogen atom, a substituted or unsubstituted linear, branched or cyclic $C_1$-$C_{20}$ alkyl group or a substituted or unsubstituted $C_6$-$C_{20}$ aryl group; $R^{12}$ is a $C_2$-$C_6$ linear, branched or cyclic alkylene group; o is an integer from 1 to about 5; $R^2$ and $R^4$ may be bonded to each other to form a bivalent group represented by —C(O)—Z—C(O)— or —$(CH_2)_pOC(O)$—, wherein Z is —O— or —$N(R^{13})$— and p is an integer from 1 to about 3; wherein $R^{13}$ represents a hydrogen atom or a $C_1$-$C_{10}$ alkyl group; m is an integer from 0 to about 4; and X and Y are independently —$CH_2$—, —O—, or —S—; with the proviso that Structure I does not contain an acid sensitive group.

Suitable examples of $R^6$, $R^7$, $R^8$, $R^9$ and $R^{10}$ include, but are not limited to, a hydrogen atom, methyl, ethyl, propyl, butyl, hexyl, cyclohexyl, nonyl, trifluoromethyl, pentafluoroethyl, bicyclo[2.2.1]hept-2-yl, adamantyl, 1-adamantylmethyl and phenyl. The preferred examples of $R^6$, $R^7$, $R^8$, $R^9$ and $R^{10}$ are a hydrogen atom, methyl, trifluoromethyl, phenyl and the like.

Suitable examples of $R^{12}$ groups include, but are not limited to, ethylene, propylene, isopropylene, hexylene, cyclohexylene, tetrafluoroethylene and the like. Preferred examples of $R^{12}$ are methylene, ethylene, isopropylene, and tetrafluoroethylene. Suitable examples of $R^{13}$ include, but are not limited to, a hydrogen atom, methyl, ethyl and cyclohexyl. The preferred examples of $R^{13}$ are a hydrogen atom, methyl and the like.

Suitable examples of $R^5$ include, but are not limited to, hydroxyl, methoxy, ethoxy, cyclohexyloxy, —$OCH_2OH$, —$OCH_2CH_2OH$, —$OCH_2CH_2OCH_2CH_2OH$, —C(═O)$OCH_3$, —C(═O)$OCH_2CH_3$, —C(═O)$OCH_2CH_2OH$, —C(═O)$OCH_2CH_2OCH_2CH_2OH$, —OC(═O)$CH_3$, —OC(═O)H, —OC(═O)-cyclohexyl, —OC(═O)$C_2H_5$, bicyclo[2.2.1]hept-2-ylcarboxylate, bicyclo[2.2.1]hept-2-acetate, cis-bicyclo[3.3.0]oct-2-ylcarboxylate, 1-adamantanecarboxylate, 3-methyl-1-adamantanecarboxylate, 3,5-dimethyl-1-adamantanecarboxylate, 1-adamantylacetate, 3-methyl-1-adamantylacetate, tricyclo[3.3.1.$0^{3,7}$]nonane-3-carboxylate and the like. The preferred polar group is a hydroxyl or a hydroxyl containing group.

Suitable examples of $R^1$, $R^2$, $R^3$ and $R^4$ include, but are not limited to, hydrogen, methyl, ethyl, propyl, isopropyl, butyl, hexyl, 2-methylbutyl, nonyl, cyclopropyl, cyclobutyl, cyclopentyl, cyclohexyl, cycloheptyl, trifluoromethyl, pentafluoroethyl, fluoro, chloro, hydroxyl, methoxy, ethoxy, cyclohexyloxy, hydroxymethyl, hydroxyethyl, methoxymethyl, methoxyethyl, ethoxyethyl, ethoxymethyl, cyclohexyloxymethyl, methoxycyclohexyl, —$OCH_2OH$, —$CH_2OCH_2OH$, —$CH_2CH_2OCH_2OH$, —$OCH_2CH_2OH$, —$C_3H_6OCH_2CH_2OH$, —$OCH_2CH_2OCH_2CH_2OH$, —C(═O)$OCH_3$, —$C_5H_{10}$C(═O)$OCH_3$—$CH_2CH_2$C(═O)$OCH_2CH_3$, —C(═O)$OCH_2CH_2OH$, —$CH_2$C(═O)$OCH_2CH_2OH$, —C(═O)$OCH_2CH_2OCH_2CH_2OH$, —$CH_2$OC(═O)$CH_3$, —$CH_2$C(═O)H, —$CH_2CH_2$C(═O)$CH_3$, —$CH_2$C(═O)-cyclohexyl, —OC(═O)H, —OC(═O)$CH_3$, —OC(═O)$C_2H_5$, —$CH_2$C(═O)$C_2H_5$, bicyclo[2.2.1]hept-2-ylcarboxylate, bicyclo[2.2.1]hept-2-acetate, cis-bicyclo[3.3.0]oct-2-ylcarboxylate, octahydropentalene-1-carboxylate, 1-adamantanecarboxylate, 3-methyl-1-adamantanecarboxylate, 3,5-dimethyl-1-adamantanecarboxylate, 1-adamantylacetate, 3-methyl-1-adamantylacetate, tricyclo[3.3.1.$0^{3,7}$]nonane-3-carboxylate, methyl(bicyclo[2.2.1]hept-2-ylcarboxylate, methyl(bicyclo[2.2.1]hept-2-acetate, methylcis-bicyclo[3.3.0]oct-2-ylcarboxylate, methyloctahydropentalene-1-carboxylate, methyl-1-adamantanecarboxylate, methyl-3-methyl-1-adamantanecarboxylate, methyl-3,5-dimethyl-1-adamantanecarboxylate, methyl-1-adamantylacetate, methyl-3-methyl-1-adamantylacetate, methyltricyclo[3.3.1.$0^{3,7}$]nonane-3-carboxylate and the like.

Illustrative examples of Structure I generating monomers include, but are not limited to, bicyclo[2.2.1]hept-2-ene, 5-methylbicyclo[2.2.1]hept-2-ene, 5-ethyl bicyclo[2.2.1]hept-2-ene, 5-propyl bicyclo[2.2.1]hept-2-ene, 5-butyl bicyclo[2.2.1]hept-2-ene, 5-pentyl bicyclo[2.2.1]hept-2-ene, 5-hexyl bicyclo[2.2.1]hept-2-ene, 5-heptyl bicyclo[2.2.1]hept-2-ene, 5-octyl bicyclo[2.2.1]hept-2-ene, 5-decyl bicyclo[2.2.1]hept-2-ene, 5-dodecyl bicyclo[2.2.1]hept-2-ene, 5,6-dimethyl bicyclo[2.2.1]hept-2-ene, 5-methyl-5-ethyl bicyclo[2.2.1]hept-2-ene, 5-phenyl bicyclo[2.2.1]hept-2-ene, 5-cyclohexyl bicyclo[2.2.1]hept-2-ene, 5-fluoro-bicyclo[2.2.1]hept-2-ene, 5-chloro bicyclo[2.2.1]hept-2-ene, bicyclo[2.2.1]hept-5-en-2-ol, bicyclo[2.2.1]hept-5-en-2-yl acetate, bicyclo[2.2.1]hept-5-en-2-yl methanol, bicyclo[2.2.1]hept-5-en-2-yl methyl acetate, bicyclo[2.2.1]hept-5-en-2-yl ethanol, bicyclo[2.2.1]hept-5-ene-2,3-diyl diacetate, bicyclo[2.2.1]hept-5-ene-2,3-diol, bicyclo[2.2.1]hept-5-ene-2,3-diyldimethanol, bicyclo[2.2.1]hept-5-en-2-yl ethyl acetate, bicyclo[2.2.1]hept-5-en-2,3-diyl methyl acetate, 3-chlorobicyclo[2.2.1]hept-5-en-2-yl acetate, 3-methylbicyclo[2.2.1]hept-5-en-2-yl acetate, (3-methylbicyclo[2.2.1]hept-5-en-2-yl)methyl acetate, (3-chlorobicyclo[2.2.1]hept-5-en-2-yl)methyl acetate, [3-(trichloromethyl)bicyclo[2.2.1]hept-5-en-2-yl]methyl acetate, [3-(trifluoromethyl)bicyclo[2.2.1]hept-5-en-2-yl]methyl acetate, 5-(methoxymethyl)bicyclo[2.2.1]hept-2-ene, bicyclo[2.2.1]hept-5-en-2-yl bicyclo[2.2.1]heptane-2-carboxylate, bicyclo[2.2.1]hept-5-en-2-ylmethyl bicyclo[2.2.1]heptane-2-carboxylate, bicyclo[2.2.1]hept-5-en-2-yl bicyclo[2.2.1]hept-2-ylacetate, bicyclo[2.2.1]hept-5-en-2-ylmethyl bicyclo[2.2.1]hept-2-yl acetate, bicyclo[2.2.1]hept-5-en-2-yl 1-adamantylacetate, bicyclo[2.2.1]hept-5-en-2-yl adamantane-1-carboxylate, bicyclo[2.2.1]hept-5-en-2-ylmethyl 1-adamantylacetate, bicyclo[2.2.1]hept-5-en-2-ylmethyl adamantane-1-carboxylate, 3-chloro bicyclo[2.2.1]hept-2-ene, bicyclo[2.2.1]hept-5-ene-2-carboxylic acid, methyl bicyclo[2.2.1]hept-5-ene-2-carboxylate, 2-hydroxyethyl bicyclo[2.2.1]hept-5-ene-2-carboxylate, 2-hydroxyethyl 3-methylbicyclo[2.2.1]hept-5-ene-2-carboxylate, 2-(bicyclo[2.2.1]hept-5-en-2-yloxy)ethanol, 2-(bicyclo[2.2.1]hept-5-en-2-yloxy)ethanol, 2-(bicyclo[2.2.1]hept-5-en-2-yloxy)ethyl acetate, 5-bicyclo[2.2.1]hept-2-ene spiro-N-phenylsuccinimide, 5-bicyclo[2.2.1]hept-2-ene spiro-N-cyclohexylsuccinimide, 5-bicyclo[2.2.1]hept-2-ene spiro-N-ethylsuccinimide, 7-oxabicyclo[2.2.1]hept-5-en-2-ylmethanol, 7-thiabicyclo[2.2.1]hept-5-en-2-ylmethanol, 2-hydroxyethyl 7-thiabicyclo[2.2.1]hept-5-ene-2-carboxylate, 7-thiabicyclo[2.2.1]hept-5-ene-2-carboxylic acid, 2-hydroxyethyl 7-oxabicyclo[2.2.1]hept-5-ene-2-carboxylate, 7-oxabicyclo[2.2.1]hept-5-ene-2-carboxylic acid, 7-oxabicyclo[2.2.1]hept-5-en-2-yl acetic acid, 3-tricyclo[4.3.0.$1^{2,5}$]decene, 3-tetracyclo[4.4.0.$1^{2,5}$.$1^{7,10}$]dodecene, tetracyclo[4.4.0.$1^{2,5}$.$1^{7,10}$]dodec-3-en-8-ol, tetracyclo[4.4.0.$1^{2,5}$.$1^{7,10}$]dodec-3-en-8-yl acetate, 8-methyl-3-tetracyclo[4.4.0.$1^{2,5}$.$1^{7,10}$]dodecene, 8-ethylidene-3-tetracyclo[4.4.0.$1^{2,5}$.$1^{7,10}$]dodecene, 8-methyl-8-methoxycarbonyl-3-tetracyclo[4.4.0.$1^{2,5}$.$1^{7,10}$]dodecene, 8-methyl-8-ethoxycarbonyl-3-tetracyclo-[4.4.0.$1^{2,5}$.$1^{7,10}$]dodecene, (tetracyclo[4.4.0.$1^{2,5}$.$1^{7,10}$]dodec-8-ene-3-yloxy)ethanol, tetracyclo[4.4.0.$1^{2,5}$.$1^{7,10}$]dodec-8-ene-3-yl-acetate, tetracyclo[4.4.0.$1^{2,5}$.$1^{7,10}$]dodec-8-ene-3-ylmethanol, tetracyclo[4.4.0.$1^{2,5}$.$1^{7,10}$]dodec-8-ene-3-ol and the like.

The preferred monomers generating Structure (I) are bicyclo[2.2.1]hept-2-ene, 5-butylbicyclo[2.2.1]hept-2-ene, bicyclo[2.2.1]hept-5-ene-2-carboxylic acid, 2-hydroxyethyl bicyclo[2.2.1]hept-5-ene-2-carboxylate, bicyclo[2.2.1]hept-5-en-2-yl acetate, bicyclo[2.2.1]hept-5-en-2-yl methanol, bicyclo[2.2.1]hept-5-en-2-yl methyl acetate, bicyclo[2.2.1]hept-5-en-2-yl ethanol, bicyclo[2.2.1]hept-5-ene-2,3-diyl diacetate, bicyclo[2.2.1]hept-5-ene-2,3-diol, bicyclo[2.2.1]hept-5-ene-2,3-diyldimethanol, bicyclo[2.2.1]hept-5-en-2-yl ethyl acetate, 2-(bicyclo[2.2.1]hept-5-en-2-yloxy)ethanol, tetracyclo[4.4.0.$1^{2,5}$.$1^{7,10}$]dodec-8-ene-3-yl-acetate and tetracyclo[4.4.0.$1^{2,5}$.$1^{7,10}$]dodec-8-ene-3-ol.

The more preferred monomers generating Structure (I) are bicyclo[2.2.1]hept-2-ene, 5-butylbicyclo[2.2.1]hept-2-ene, bicyclo[2.2.1]hept-5-ene-2-carboxylic acid, 2-hydroxyethyl bicyclo[2.2.1]hept-5-ene-2-carboxylate, bicyclo[2.2.1]hept-5-en-2-yl acetate, bicyclo[2.2.1]hept-5-en-2-yl methanol, bicyclo[2.2.1]hept-5-en-2-yl methyl acetate, tetracyclo

[4.4.0.1$^{2,5}$.1$^{7,10}$]dodec-8-ene-3-yl-acetate and tetracyclo [4.4.0.1$^{2,5}$.1$^{7,10}$]dodec-8-ene-3-ol.

The most preferred monomers generating Structure (I) are bicyclo[2.2.1]hept-2-ene, 5-butylbicyclo[2.2.1]hept-2-ene, 2-hydroxyethyl bicyclo[2.2.1]hept-5-ene-2-carboxylate, bicyclo[2.2.1]hept-5-en-2-yl acetate, bicyclo[2.2.1]hept-5-en-2-yl methyl acetate and tetracyclo[4.4.0.1$^{2,5}$.1$^{7,10}$]dodec-8-ene-3-yl-acetate.

The polymer used in the present disclosure further comprises a repeating unit represented by Structure (II)

Structure II

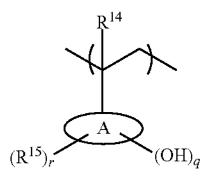

wherein $R^{14}$ is a hydrogen atom, a $C_1$-$C_3$ alkyl group, a fully or partially halogen substituted $C_1$-$C_3$ alkyl group, or a halogen atom; A represents a $C_6$-$C_{20}$ arylene group or an $A^1$-W-$A^2$ group, wherein $A^1$ is a $C_6$-$C_{10}$ arylene group, $A^2$ is a $C_6$-$C_{10}$ aryl group and W is selected from the group of a single bond, —S—, —O—, —C(O)—, —C(O)O—, —C($R^{16}R^{17}$)—, —C(═C$R^{18}R^{19}$)— and —C$R^{18}$═C$R^{19}$—, wherein $R^{16}$, $R^{17}$, $R^{18}$ and $R^{19}$ are independently a hydrogen atom, a halogen atom, a cyano group or a $C_1$-$C_{10}$ alkyl group or a partial or complete halogen substituted $C_1$-$C_{10}$ alkyl group; $R^{15}$ is a halogen atom, a linear, branched or cyclic $C_1$-$C_{10}$ alkyl group, or a partial or complete halogen substituted $C_1$-$C_{10}$ alkyl group; q is an integer from 1 to 2; and r is an integer from 0 to about 3; with the proviso that Structure II does not contain an acid sensitive group.

Suitable examples of $R^{14}$ groups include, but are not limited to, methyl, ethyl, propyl, isopropyl, chloro, fluoro, bromo, trifluoromethyl and the like. Suitable examples of $R^{15}$ groups include but are not limited to methyl, ethyl, propyl, isopropyl, n-butyl, sec-butyl, tert-butyl, pentyl, hexyl, cyclohexyl, cyclopentyl, octyl, cyclooctyl, cyclononyl, trifluoromethyl, pentafluoroethyl, chloro, fluoro, bromo and the like. Suitable examples of $R^{16}$, $R^{17}$, $R^{18}$ and $R^{19}$ groups include but are not limited to hydrogen atom, methyl, ethyl, isopropyl, chloro, fluoro, bromo, trichloromethyl, trifluoromethyl, 1,1,1,2,2-pentafluoroethyl, 1,1,1,2,2,3,3-heptafluoropropyl, cyano and the like. Suitable examples of W include but not limited to, single bond, —S—, —O—, —C(═O)—, —C(═O)O—, methylene, ethylene, isopropylene, 1,2-dimethylethylene, 1,1-dimethylethylene, bis(trifluoromethyl)methylene, 1,1-difluoromethylene and the like. Suitable examples of $A^1$ include, but are not limited to, substituted and unsubstituted phenylene, substituted and unsubstituted naphthylene and the like. Suitable examples of $A^2$ include, but are not limited to, phenyl, naphthyl and the like.

Suitable examples of A include, but are not limited to, phenylene, naphthylene, anthracenylene, phenanthracenylene, indenylene, biphenylene, 4-benzylphenylene, 4-phenoxyphenylene, 4-phenacylphenylene, 4-phenylisopropylidenephenylene, 4-phenyl-(1,1,1,3,3,3)-hexafluoroisopropylidenephenylene, 4-phenylcarbonylphenylene, and the like. Preferred A examples include phenylene, biphenylene, benzylphenylene and 4-phenoxyphenylene.

Suitable examples of $A(OH)_q(R^{15})_r$ include, but are not limited to,

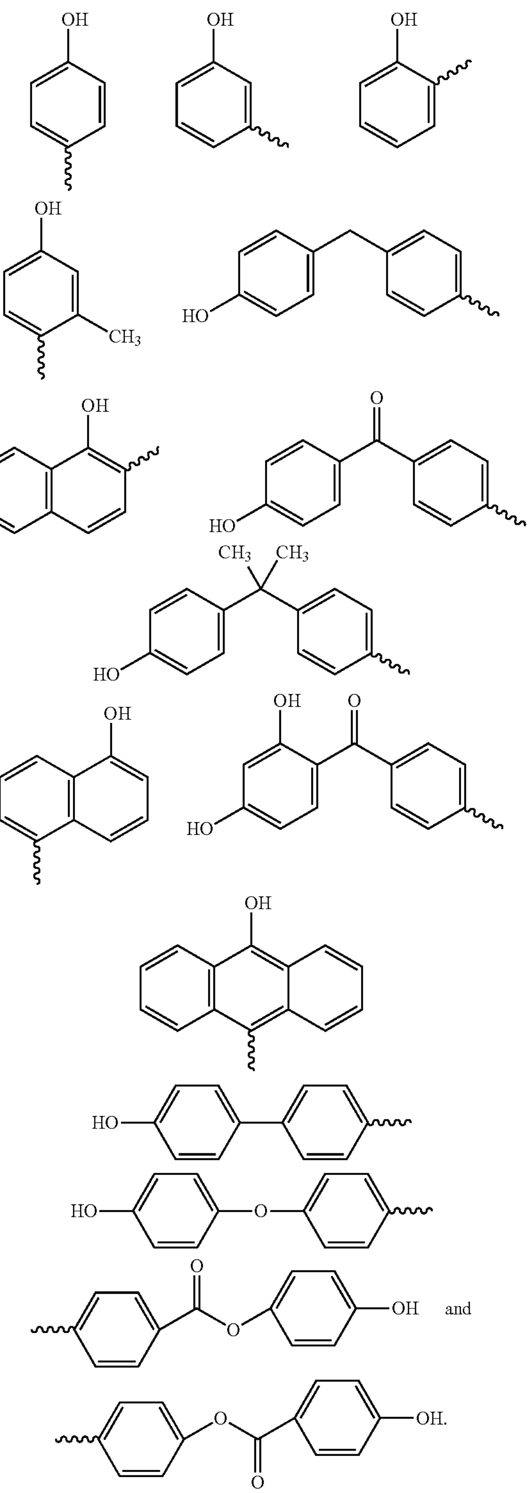

The hydroxyl groups in the monomeric unit described by Structure (II) may interfere with the polymerization process. In practice the actual monomer employed for the polymerization contains a readily removable protecting group for the hydroxyl functionality. Examples of such protecting groups include, but are not limited to, acetoxy and trialkylsiloxy groups. Subsequent to the polymerization, the protecting groups are removed.

Illustrative examples of monomers generating Structure (II) after deprotection include, but are not limited to, 4-vinylphenyl acetate, 4-vinyl trimethylsiloxybenzene, 3-vinyl trimethylsiloxybenzene, 2-vinylphenyl acetate, 3-vinylphenyl acetate, 4-vinyl-1,2-phenylene diacetate, 5-vinylbenzene-1,2,3-triyl triacetate, 4-isopropenylphenyl acetate, 2-methyl-4-vinylphenyl acetate, 2-chloro-4-vinylphenyl acetate, 2-tert-butyl-4-vinylphenyl acetate, 4-vinyl-1-naphthyl acetate, 2-vinyl-1-naphthyl acetate, 9-vinyl-2-anthryl acetate, 9-vinyl-1-anthryl acetate, 4'-vinylbiphenyl-4-yl acetate, 4-(4-vinylbenzyl)phenyl acetate, 4-[1-methyl-1-(4-vinylphenyl)ethyl]phenyl acetate, 4-(4-vinylbenzoyl)phenyl acetate, 4-[2,2,2-trifluoro-1-(trifluoromethyl)-1-(4-vinylphenyl)ethyl]phenyl acetate, 4-(4-vinylphenoxy)phenyl acetate, 4-[(4-vinylphenyl)thio]phenyl acetate, 4-acetoxyphenyl 4-vinylbenzoate, 4-acetoxy-3-methylphenyl 4-vinylbenzoate, 4-vinylphenyl 4-acetoxybenzoate and the like. Preferred examples of monomers generating Structure (II) include 4-vinylphenyl acetate, 2-vinylphenyl acetate, 3-vinylphenyl acetate, 4-vinyl trimethylsiloxybenzene, 3-vinyl trimethylsiloxybenzene, 4-vinyl-1,2-phenylene diacetate, 4'-vinylbiphenyl-4-yl acetate and 4-vinyl-1-naphthyl acetate. The more preferred monomer generating Structure (II) are 4-vinylphenyl acetate, 3-vinylphenyl acetate, 4-vinyl trimethylsiloxybenzene, 3-vinyl trimethylsiloxybenzene, 4-vinyl-1,2-phenylene diacetate, 4'-vinylbiphenyl-4-yl acetate and 4-vinyl-1-naphthyl acetate. The most preferred monomer generating Structure (II) are 4-vinylphenyl acetate, 3-vinylphenyl acetate, 4-vinyl trimethylsiloxybenzene, and 4'-vinylbiphenyl-4-yl acetate.

The polymer used in the present disclosure further comprises a repeating unit represented by Structure III Structure III

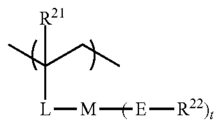

wherein $R^{21}$ is a hydrogen atom, a $C_1$-$C_3$ alkyl group, a fully or partially halogen substituted $C_1$-$C_3$ alkyl group, or a halogen atom; L represents a single bond, a —C(O)O—, —C(O)O($R^{23}$O)$_s$— or a —C(O)N$R^{24}$— group, wherein $R^{23}$ represents a $C_2$-$C_6$ alkylene group; $R^{24}$ represents a hydrogen atom, or a linear, branched or cyclic $C_1$-$C_{10}$ alkyl group; and s is an integer from 1 to about 4; M represents a $C_5$-$C_{20}$ cycloalkylene group or a $C_6$-$C_{18}$ arylene group; E represents a single bond, —O—, —C(O)O—, —C(O)—, or —S($O_2$)—; $R^{22}$ represents a hydrogen atom, a substituted or unsubstituted linear, branched or cyclic $C_1$-$C_{10}$ alkyl group, alicyclic $C_5$-$C_{15}$ hydrocarbon group, a $C_6$-$C_{18}$ aryl group or a $C_7$-$C_{18}$ alkylaryl group and t is an integer from 1 to about 4; with the proviso that when L is a single bond and M is an arylene group E-$R^{22}$ is not —OH; and with the proviso that Structure III does not contain an acid sensitive group.

Suitable examples of $R^{21}$ groups include, but are not limited to, methyl, ethyl, propyl, isopropyl, chloro, fluoro, bromo, trifluoromethyl and the like. Suitable examples of $R^{23}$ include, but are not limited to, ethylene, propylene, butylene, isopropylene isobutylene and hexylene. Preferred examples of $R^{23}$ include, but are not limited to, ethylene, propylene, and isopropylene. Suitable examples of $R^{24}$ include, but are not limited to, a hydrogen atom, methyl, ethyl, cyclohexyl and nonyl. The preferred examples of $R^{24}$ are a hydrogen atom, methyl and the like. Suitable examples of L include, but are not limited to, a single bond, —C(O)O—, —C(O)NH—, —C(O)N($CH_3$)—, —C(O)O$C_2H_4$O—, and —C(O)O$C_2H_4$O$C_2H_4$O— and the like.

Suitable examples of M include, but are not limited to, phenylene, naphthylene, cyclohexylene, cyclopentylene, bicyclo[2.1.1]hexylene, bicyclo[2.2.1]heptylene, bicyclo[3.1.1]heptylene, adamantylene, adamantylmethylene, tricyclo[5,2,1,$0^{2,6}$]decanylene, tricyclo[5,2,1,$0^{2,6}$]decanemethylene, tetracyclo[4,4,0,$1^{2,5}$,$1^{7,10}$]dodecanylene and the like. Preferred examples of M include phenylene, cyclohexylene, bicyclo[2.2.1]heptylene, bicyclo[3.1.1]heptylene, adamantylene, tricyclo[5,2,1,$0^{2,6}$]decanylene, tricyclo[5,2,1,$0^{2,6}$]decanemethylene and tetracyclo[4,4,0,$1^{2,5}$$1^{7,10}$]dodecanylene.

Suitable examples of $R^{22}$ include, but are not limited to, hydrogen atom, methyl, ethyl, propyl, butyl, isopropyl, isobutyl, tert-butyl, cyclohexyl, cyclopentyl, cycloheptyl cyclooctyl, cyclononyl, cyclodecanyl, cyclodecanemethyl, cyclododecyl, cyclodecanemethyl, bicyclo[1.1.1]pentyl, bicyclo[2.1.1]hexyl, bicyclo[2.2.1]heptyl, bicyclo[3.1.1]heptyl, bicyclo[2.2.2]octyl, bicyclo[3.2.1]octyl, bicyclo[4.1.1]octyl, bicyclo[3.2.2]nonyl, bicyclo[3.3.1]nonyl, bicyclo[4.2.1]nonyl, bicyclo[5.1.1]nonyl, bicyclo[3.3.2]decyl, bicyclo[4.2.2]decyl, bicyclo[4.3.1]decyl, bicyclo[5.2.1]decyl, bicyclo[3.3.3]undecyl, bicyclo[4.3.2]undecyl, bicyclo[4.4.1]undecyl, bicyclo[5.3.1]undecyl, bicyclo[4.4.2]dodecyl, bicyclo[5.3.2]dodecyl, bicyclo[5.3.3]tridecyl, bicyclo[5.4.2]tridecyl, bicyclo[5.5.1]tridecyl, adamantyl, adamantylmethyl, tricyclo[5,2,1,$0^{2,6}$]decanyl, tricyclo[5,2,1,$0^{2,6}$]decanemethyl, tetracyclo[4,4,0,$1^{2,5}$$1^{7,10}$]dodecanyl, phenyl, benzyl, phenylethyl, naphthyl, naphthylmethyl and the like. Preferred $R^{22}$ are a hydrogen atom, methyl, ethyl, cyclohexyl, bicyclo[2.2.1]heptyl, adamantyl, adamantylmethyl, tricyclo[5,2,1,$0^{2,6}$]decanyl, tricyclo[5,2,1,$0^{2,6}$]decyl, tricyclo[5,2,1,$0^{2,6}$]decanemethyl, tetracyclo[4,4,0,$1^{2,5}$.$1^{7,10}$]dodecanyl, phenyl, benzyl and phenylethyl group.

Suitable examples of -M(-E-$R^{22}$)$_t$ include, but are not limited to, cyclohexyl, cyclopentyl, cycloheptyl, 3,5-dimethylcyclohexyl, 4-cyclohexylphenyl, 4-biphenyl, 4-(4'-methylcyclohexyl)phenyl, 4-(4'-tert-butylcyclohexyl)phenyl, 4-(4'-chlorocyclohexyl)phenyl, bicyclo[2.1.1]hexyl, bicyclo[2.2.1]heptyl, isobornyl, adamantyl, 3-hydroxyadamantyl, 3,5-dihydroxyadamantyl, tricyclo[5,2,1,$0^{2,6}$]decyl, 4-hydroxytricyclo[5.2.1.$0^{2,6}$]dec-8-yl-2-methyl, 3,4-dihydroxytricyclo[5.2.1.$0^{2,6}$]dec-8-yl, tricyclo[5,2,1,$0^{2,6}$]decanemethyl, tetracyclo[4,4,0,$1^{2,5}$.$1^{7,10}$]dodecanyl, tetracyclo[4,4,0,$1^{2,5}$.$1^{7,10}$]dodecanemethyl, ethylene glycol methyl ether, ethylene glycol ethyl ether, ethylene glycol dicyclopentenyl ether and the like.

Illustrative examples of monomers generating Structure III include, but are not limited to, styrene, 4-cylohexylstyrene, 4-N-methylphenylacrylamide, N-methylphenylmethacrylamide, N,N-dimethylacrylamide, 4-cyclohexylphenylacrylate, 4-cyclohexylphenylmethacrylate, 4-cyclopentylphenylacrylate, 4-cyclopentylphenylmethacrylate, 4-cycloheptylphenylacrylate, 4-cycloheptylphenylmethacrylate, 3-cyclohexylphenylacrylate, 3-cyclohexylphenylmethacrylate, 3-cyclopentylphenylacrylate, 3-cyclopentylphenylmethacrylate, 3-cycloheptylphenylacrylate, 3-cycloheptylphenylmethacrylate, 2-cyclohexylphenylacrylate, 2-cyclohexylphenylmethacrylate, 2-cyclopentylphenylacrylate, 2-cyclopentylphenylmethacrylate, 2-cycloheptylphenylacrylate, 2-cycloheptylphenylmethacrylate, 4-biphenylacrylate, 4-biphenylmethacrylate, 4-(4'-methylcyclohexyl)phenylacrylate, 4-(4'-methylcyclohexyl)phenylmethacrylate, 4-(3'-methylcyclohexyl)phenylacrylate, 4-(3'-methylcyclohexyl)phenylmethacrylate, 4-(4'-tert-butylcyclohexyl)phenylacrylate, 4-(4'-tert-butylcyclohexyl) phenylmethacrylate, 4-(4'-chlorocyclohexyl)phenylacrylate, 4-(4'-chlorocyclohexyl)phenylmethacrylate, cyclohexylacrylate, cyclohexylmethacrylate, cyclopentylacrylate, cyclopentylmethacrylate, cycloheptylacrylate, cycloheptylmethacrylate, bicyclo[2.1.1]hexylacrylate, bicyclo[2.1.1] hexylmethacrylate, bicyclo[2.2.1]heptylacrylate, isobornylacrylate, isobornylmethacrylate, adamantylacrylate, adamantylmethacrylate, 3-hydroxyadamantylmethacrylate, 3,5-dihydroxyadamantylmethacrylate, tricyclo[5,2,1,$0^{2,6}$] decylacrylate, tricyclo[5,2,1,$0^{2,6}$]decylmethylacrylate, 4-hydroxytricyclo[5.2.1.$0^{2,6}$]dec-8-yl 2-methylacrylate, 3,4-dihydroxytricyclo[5.2.1.$0^{2,6}$]dec-8-yl2-methylacrylate, tricyclo[5,2,1,$0^{2,6}$]decanemethylmethacrylate, tetracyclo[4,4,0,$1^{2,5}$.$1^{7,10}$]dodecanylacrylate, tetracyclo[4,4,0,$1^{2,5}$.$1^{7,10}$] dodecanylmethacrylate, ethylene glycol methyl ether acrylate, ethylene glycol methyl ether methacrylate, ethylene glycol ethyl ether acrylate, ethylene glycol ethyl ether methacrylate, ethylene glycol dicyclopentenyl ether acrylate, ethylene glycol dicyclopentenyl ether methacrylate and the like. More preferred examples of monomers generating Structure (III) include, but are not limited to, cyclohexylacrylate, cyclohexylmethacrylate, cyclopentylacrylate, cyclopentylmethacrylate, bicyclo[2.1.1]hexylacrylate, bicyclo[2.1.1] hexylmethacrylate, bicyclo[2.2.1]heptylacrylate, isobornylacrylate, isobornylmethacrylate, adamantylacrylate, adamantylmethacrylate, 3-hydroxy-1-adamantyl-2-methacrylate, 3,5-dihydroxy-1-adamantyl-2-methacrylate, tricyclo[5,2,1,$0^{2,6}$]decylacrylate, 4-hydroxytricyclo [5.2.1.$0^{2,6}$]dec-8-yl 2-methylacrylate, 3,4-dihydroxytricyclo [5.2.1.$0^{2,6}$]dec-8-yl2-methylacrylate, tricyclo[5,2,1,$0^{2,6}$]decylmethylacrylate, tricyclo[5,2,1,$0^{2,6}$] decanemethylmethacrylate, tetracyclo[4,4,0,$1^{2,5}$.$1^{7,10}$] dodecanylacrylate, tetracyclo[4,4,0,$1^{2,5}$.$1^{7,10}$] dodecanylmethacrylate, ethylene glycol dicyclopentenyl ether acrylate, ethylene glycol dicyclopentenyl ether methacrylate, ethylene glycol phenyl ether acrylate, ethylene glycol phenyl ether methacrylate, ethylene glycol benzyl ether acrylate and ethylene glycol benzyl ether methacrylate and the like.

Most preferred examples of monomers generating Structure (III) include tricyclo[5,2,1,$0^{2,6}$]decylacrylate, tricyclo[5,2,1,$0^{2,6}$]decylmethacrylate, cyclohexylacrylate, bicyclo [2.1.1]hexylacrylate, bicyclo[2.1.1]hexylmethacrylate, adamantylmethacrylate, 3-hydroxy-1-adamantyl-2-methacrylate, 3,5-dihydroxy-1-adamantyl-2-methacrylate, 4-hydroxytricyclo[5.2.1.$0^{2,6}$]dec-8-yl 2-methylacrylate, 3,4-dihydroxytricyclo[5.2.1.$0^{2,6}$]dec-8-yl2-methylacrylate, tricyclo[5,2,1,$0^{2,6}$]decylmethylacrylate, tricyclo[5,2,1,$0^{2,6}$] decanemethylmethacrylate, tetracyclo[4,4,0,$1^{2,5}$.$1^{7,10}$]dodecanylacrylate, tetracyclo[4,4,0,$1^{2,5}$.$1^{7,10}$]dodecanylmethacrylate and the like.

A preferred embodiment of the thermally curable Underlayer composition comprises a polymer comprising structures Ia, IIa, and IIIa-1

Ia

-continued

IIa

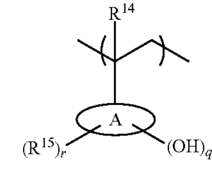

IIIa-1

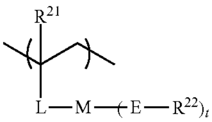

wherein $R^1$, $R^2$, $R^3$, $R^4$, and X are as defined for Structure I; $R^{14}$, $R^{15}$, r and q are as defined for Structure II; A represents a naphthyl or phenyl group; M is a $C_6$-$C_{18}$ arylene group, $R^{21}$ is defined as in Structure III; L represents a single bond or —C(O)O—; E is a single bond, —O— or —C(O)O—; $R^{22}$ represents a hydrogen atom, a substituted or unsubstituted linear branched or cyclic $C_1$-$C_{10}$ alkyl group or a substituted or unsubstituted alicyclic $C_5$-$C_{15}$ group; and t is an integer from 1 to about 3; with the proviso that when L is a single bond E-$R^{22}$ is not —OH; and with the proviso that none of the repeating units of Structure Ia or IIa or IIIa-1 contain acid sensitive groups.

Illustrative examples of Structure Ia generating monomers include, but are not limited to, bicyclo[2.2.1]hept-2-ene, 5-methylbicyclo[2.2.1]hept-2-ene, 5-ethyl bicyclo[2.2.1] hept-2-ene, 5-propyl bicyclo[2.2.1]hept-2-ene, 5-butyl bicyclo[2.2.1]hept-2-ene, 5-pentyl bicyclo[2.2.1]hept-2-ene, 5-hexyl bicyclo[2.2.1]hept-2-ene, 5-heptyl bicyclo[2.2.1] hept-2-ene, 5-octyl bicyclo[2.2.1]hept-2-ene, 5-decyl bicyclo [2.2.1]hept-2-ene, 5-dodecyl bicyclo[2.2.1]hept-2-ene, 5,6-dimethyl bicyclo[2.2.1]hept-2-ene, 5-methyl-5-ethyl bicyclo [2.2.1]hept-2-ene, 5-phenyl bicyclo[2.2.1]hept-2-ene, 5-cyclohexyl bicyclo[2.2.1]hept-2-ene, 5-fluoro-bicyclo [2.2.1]hept-2-ene, 5-chloro bicyclo[2.2.1]hept-2-ene, bicyclo[2.2.1]hept-5-en-2-ol, bicyclo[2.2.1]hept-5-en-2-yl acetate, bicyclo[2.2.1]hept-5-en-2-yl methanol, bicyclo [2.2.1]hept-5-en-2-ylmethyl acetate, bicyclo[2.2.1]hept-5-en-2-yl ethanol, bicyclo[2.2.1]hept-5-ene-2,3-diyl diacetate, bicyclo[2.2.1]hept-5-ene-2,3-diol, bicyclo[2.2.1]hept-5-ene-2,3-diyl dimethanol, bicyclo[2.2.1]hept-5-en-2-yl ethyl acetate, bicyclo[2.2.1]hept-5-en-2,3-diyl methyl acetate, 3-chlorobicyclo[2.2.1]hept-5-en-2-yl acetate, 3-methylbicyclo[2.2.1]hept-5-en-2-yl acetate, (3-methylbicyclo[2.2.1] hept-5-en-2-yl)methyl acetate, (3-chlorobicyclo[2.2.1]hept-5-en-2-yl)methyl acetate, [3-(trichloromethyl)bicyclo[2.2.1] hept-5-en-2-yl]methyl acetate, [3-(trifluoromethyl)bicyclo [2.2.1]hept-5-en-2-yl]methyl acetate, 5-(methoxymethyl) bicyclo[2.2.1]hept-2-ene, bicyclo[2.2.1]hept-5-en-2-yl bicyclo[2.2.1]heptane-2-carboxylate, bicyclo[2.2.1]hept-5-en-2-ylmethyl bicyclo[2.2.1]heptane-2-carboxylate, bicyclo [2.2.1]hept-5-en-2-yl bicyclo[2.2.1]hept-2-ylacetate, bicyclo [2.2.1]hept-5-en-2-ylmethyl bicyclo[2.2.1]hept-2-ylacetate, bicyclo[2.2.1]hept-5-en-2-yl 1-adamantylacetate, bicyclo [2.2.1]hept-5-en-2-yl adamantane-1-carboxylate, bicyclo [2.2.1]hept-5-en-2-ylmethyl 1-adamantylacetate, bicyclo [2.2.1]hept-5-en-2-ylmethyl adamantane-1-carboxylate, 3-chloro bicyclo[2.2.1]hept-2-ene, bicyclo[2.2.1]hept-5-ene-2-carboxylic acid, methyl bicyclo[2.2.1]hept-5-ene-2-carboxylate, 2-hydroxyethyl bicyclo[2.2.1]hept-5-ene-2-carboxylate, 2-hydroxyethyl 3-methylbicyclo[2.2.1]hept-5-ene-2-carboxylate, 2-(bicyclo[2.2.1]hept-5-en-2-yloxy)ethanol, 2-(bicyclo[2.2.1]hept-5-en-2-yloxy)ethanol, 2-(bicyclo[2.2.1]hept-5-en-2-yloxy)ethyl acetate, 7-oxabicyclo[2.2.1]hept-5-en-2-ylmethanol, 7-thiabicyclo[2.2.1]hept-5-en-2-ylmethanol, 2-hydroxyethyl 7-thiabicyclo[2.2.1]hept-5-ene-2-carboxylate, 7-thiabicyclo[2.2.1]hept-5-ene-2-carboxylic acid, 2-hydroxyethyl 7-oxabicyclo[2.2.1]hept-5-ene-2-carboxylate, 7-oxabicyclo[2.2.1]hept-5-ene-2-carboxylic acid, 7-oxabicyclo[2.2.1]hept-5-en-2-ylacetic acid and the like.

Illustrative examples of monomers generating Structure (IIa) after deprotection include, but are not limited to, 4-vinylphenyl acetate, 4-vinyl trimethylsiloxybenzene, 3-vinyl trimethylsiloxybenzene, 2-vinylphenyl acetate, 3-vinylphenyl acetate, 4-vinyl-1,2-phenylene diacetate, 5-vinylbenzene-1,2,3-triyl triacetate, 4-isopropenylphenyl acetate, 2-methyl-4-vinylphenyl acetate, 2-chloro-4-vinylphenyl acetate, 2-tert-butyl-4-vinylphenyl acetate, 4-vinyl-1-naphthyl acetate, 2-vinyl-1-naphthyl acetate and the like.

Illustrative examples of monomers generating Structure (IIIa-1) include, but are not limited to, styrene, 4-cyclohexylstyrene 4-cyclohexylphenylacrylate, 4-cyclohexylphenylmethacrylate, 4-cyclopentylphenylacrylate, 4-cyclopentylphenylmethacrylate, 4-cycloheptylphenylacrylate, 4-cycloheptylphenylmethacrylate, 3-cyclohexylphenylacrylate, 3-cyclohexylphenylmethacrylate, 3-cyclopentylphenylacrylate, 3-cyclopentylphenylmethacrylate, 3-cycloheptylphenylacrylate, 3-cycloheptylphenylmethacrylate, 2-cyclohexylphenylacrylate, 2-cyclohexylphenylmethacrylate, 2-cyclopentylphenylacrylate, 2-cyclopentylphenylmethacrylate, 2-cycloheptylphenylacrylate, 2-cycloheptylphenylmethacrylate, 4-biphenylacrylate, 4-biphenylmethacrylate, 4-(4'-methylcyclohexyl)phenylacrylate, 4-(4'-methylcyclohexyl)phenylmethacrylate, 4-(3'-methylcyclohexyl)phenylacrylate, 4-(3'-methylcyclohexyl)phenylmethacrylate, 4-(4'-tert-butylcyclohexyl)phenylacrylate, 4-(4'-tert-butylcyclohexyl)phenylmethacrylate, 4-(4'-chlorocyclohexyl)phenylacrylate, 4-(4'-chlorocyclohexyl)phenylmethacrylate, and the like.

Another preferred embodiment of the thermally curable Underlayer composition comprises a polymer comprising structures Ia, IIa, and IIIa-2

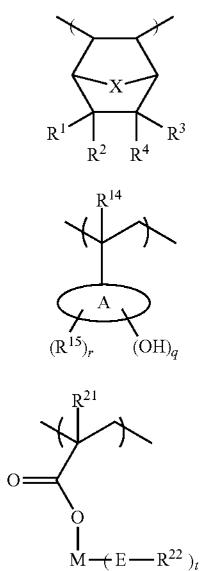

wherein Ia and IIa are as defined above, M is a $C_5$-$C_{20}$ cycloalkylene group, $R^{21}$ is as defined for Structure III, E is a single bond, —O— or —C(O)O—; $R^{22}$ represents a hydrogen atom, a substituted or unsubstituted linear branched or cyclic $C_1$-$C_{10}$ alkyl group or a substituted or unsubstituted alicyclic $C_5$-$C_{15}$ group; and t is an integer from 1 to about 3; with the proviso that none of the repeating units of Structure Ia or IIa or IIIa-2 contain acid sensitive groups.

Illustrative examples of monomers generating Structure (IIIa-2) include, but are not limited to, cyclohexylacrylate, cyclohexylmethacrylate, cyclopentylacrylate, cyclopentylmethacrylate, cycloheptylacrylate, cycloheptylmethacrylate, bicyclo[2.1.1]hexylacrylate, bicyclo[2.1.1]hexylmethacrylate, bicyclo[2.2.1]heptylacrylate, isobornylacrylate, isobornylmethacrylate, adamantylacrylate, adamantylmethacrylate, 3-hydroxyadamantylmethacrylate, 3,5-dihydroxyadamantylmethacrylate, tricyclo[5,2,1,$0^{2,6}$]decylacrylate, tricyclo[5,2,1,$0^{2,6}$]decylmethylacrylate, 4-hydroxytricyclo[5.2.1.$0^{2,6}$]dec-8-yl 2-methylacrylate, 3,4-dihydroxytricyclo[5.2.1.$0^{2,6}$]dec-8-yl2-methylacrylate, tricyclo[5,2,1,$0^{2,6}$]decanemethylmethacrylate, tetracyclo[4,4,0,$1^{2,5}$.$1^{7,10}$]dodecanylacrylate, tetracyclo[4,4,0,$1^{2,5}$.$1^{7,10}$]dodecanylmethacrylate and the like.

A more preferred embodiment of the thermally curable Underlayer composition comprises a polymer comprising structures Ib, IIb, and IIb-1

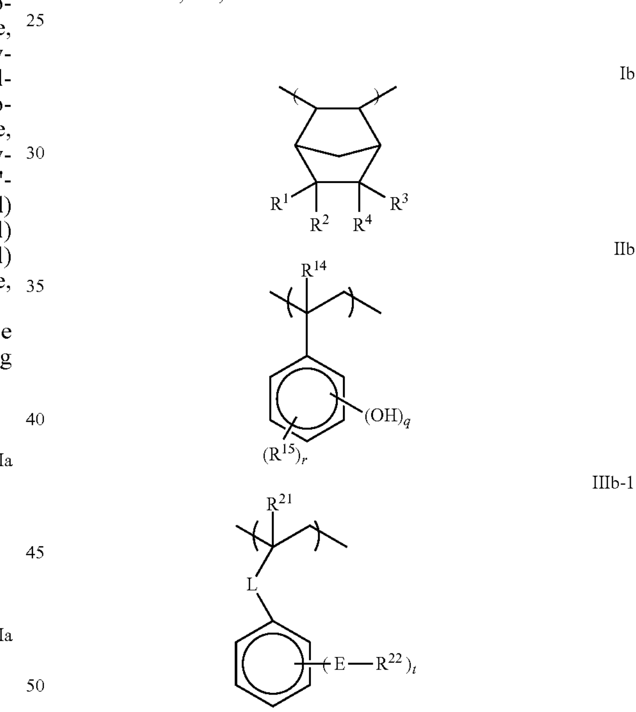

wherein $R^1$, $R^2$, $R^3$ and $R^4$ individually represent a hydrogen atom, a halogen atom, a linear, branched or cyclic $C_1$-$C_{10}$ alkyl group, a halogenated or partially halogenated linear, branched or cyclic $C_1$-$C_{10}$ alkyl group, or a polar group represented by $(CH_2)_nR^5$ wherein $R^5$ represents —$OR^6$, —$C(O)OR^8$, —$C(O)(OR^{12})_oOR^9$ or —$OC(O)R^{10}$ and n is an integer from 0 to 2; wherein $R^6$, $R^8$, $R^9$ and $R^{10}$ represent a hydrogen atom, a substituted or unsubstituted linear, branched or cyclic $C_1$-$C_{20}$ alkyl group or a substituted or unsubstituted $C_6$-$C_{20}$ aryl group; $R^{12}$ is a $C_2$-$C_6$ linear, branched or cyclic alkylene group; o is an integer from 1 to about 5; $R^{14}$, r and q are as defined for Structure II; $R^{15}$ is a halogen atom, a linear, branched or cyclic $C_1$-$C_4$ alkyl group or a partial or complete halogen substituted $C_1$-$C_4$ alkyl group; $R^{21}$ is defined as in Structure III; L represents a single bond or —C(O)O—; E is a single bond or oxygen atom; $R^{22}$ represents a hydrogen atom, a substituted or unsubstituted linear branched or cyclic $C_1$-$C_{10}$ alkyl group or a substituted or unsubstituted alicyclic $C_5$-$C_{15}$ group; and t is an integer from 1 to about 2; with the proviso that when L is a single bond -E-$R^{22}$ is not —OH and with the proviso that none of the repeating units of Structure Ib or IIb or contain acid sensitive groups.

Illustrative examples of monomers generating Structure Ib include, but are not limited to, bicyclo[2.2.1]hept-2-ene, 5-methylbicyclo[2.2.1]hept-2-ene, 5-ethyl bicyclo[2.2.1]hept-2-ene, 5-propyl bicyclo[2.2.1]hept-2-ene, 5-butyl bicyclo[2.2.1]hept-2-ene, 5-pentyl bicyclo[2.2.1]hept-2-ene, 5-hexyl bicyclo[2.2.1]hept-2-ene, 5-heptyl bicyclo[2.2.1]hept-2-ene, 5-octyl bicyclo[2.2.1]hept-2-ene, 5-decyl bicyclo[2.2.1]hept-2-ene, 5-dodecyl bicyclo[2.2.1]hept-2-ene, 5,6-dimethyl bicyclo[2.2.1]hept-2-ene, 5-methyl-5-ethyl bicyclo[2.2.1]hept-2-ene, 5-phenyl bicyclo[2.2.1]hept-2-ene, 5-cyclohexyl bicyclo[2.2.1]hept-2-ene, 5-fluoro-bicyclo[2.2.1]hept-2-ene, 5-chloro bicyclo[2.2.1]hept-2-ene, bicyclo[2.2.1]hept-5-en-2-ol, bicyclo[2.2.1]hept-5-en-2-yl acetate, bicyclo[2.2.1]hept-5-en-2-yl methanol, bicyclo[2.2.1]hept-5-en-2-yl methyl acetate, bicyclo[2.2.1]hept-5-en-2-yl ethanol, bicyclo[2.2.1]hept-5-ene-2,3-diyl diacetate, bicyclo[2.2.1]hept-5-ene-2,3-diol, bicyclo[2.2.1]hept-5-ene-2,3-diyl dimethanol, bicyclo[2.2.1]hept-5-en-2-yl ethyl acetate, bicyclo[2.2.1]hept-5-en-2,3-diyl methyl acetate, 3-chlorobicyclo[2.2.1]hept-5-en-2-yl acetate, 3-methyl bicyclo[2.2.1]hept-5-en-2-yl acetate, (3-methylbicyclo[2.2.1]hept-5-en-2-yl)methyl acetate, (3-chlorobicyclo[2.2.1]hept-5-en-2-yl)methyl acetate, [3-(trichloromethyl)bicyclo[2.2.1]hept-5-en-2-yl]methyl acetate, [3-(trifluoromethyl)bicyclo[2.2.1]hept-5-en-2-yl]methyl acetate, 5-(methoxymethyl)bicyclo[2.2.1]hept-2-ene, bicyclo[2.2.1]hept-5-en-2-yl bicyclo[2.2.1]heptane-2-carboxylate, bicyclo[2.2.1]hept-5-en-2-ylmethyl bicyclo[2.2.1]heptane-2-carboxylate, bicyclo[2.2.1]hept-5-en-2-yl bicyclo[2.2.1]hept-2-ylacetate, bicyclo[2.2.1]hept-5-en-2-ylmethyl bicyclo[2.2.1]hept-2-ylacetate, bicyclo[2.2.1]hept-5-en-2-yl 1-adamantylacetate, bicyclo[2.2.1]hept-5-en-2-yl adamantane-1-carboxylate, bicyclo[2.2.1]hept-5-en-2-ylmethyl 1-adamantylacetate, bicyclo[2.2.1]hept-5-en-2-ylmethyl adamantane-1-carboxylate, 3-chloro bicyclo[2.2.1]hept-2-ene, bicyclo[2.2.1]hept-5-ene-2-carboxylic acid, methyl bicyclo[2.2.1]hept-5-ene-2-carboxylate, 2-hydroxyethyl bicyclo[2.2.1]hept-5-ene-2-carboxylate, 2-hydroxyethyl 3-methylbicyclo[2.2.1]hept-5-ene-2-carboxylate, 2-(bicyclo[2.2.1]hept-5-en-2-yloxy)ethanol, 2-(bicyclo[2.2.1]hept-5-en-2-yloxy)ethanol, 2-(bicyclo[2.2.1]hept-5-en-2-yloxy)ethyl acetate and the like.

Illustrative examples of monomers generating Structure (IIb) after deprotection include, but are not limited to, 4-vinylphenyl acetate, 4-vinyl trimethylsiloxybenzene, 3-vinyl trimethylsiloxybenzene, 2-vinylphenyl acetate, 3-vinylphenyl acetate, 4-vinyl-1,2-phenylene diacetate, 5-vinylbenzene-1,2,3-triyl triacetate, 4-isopropenylphenyl acetate, 2-methyl-4-vinylphenyl acetate, 2-chloro-4-vinylphenyl acetate, 2-tert-butyl-4-vinylphenyl acetate and the like.

Illustrative examples of monomers generating Structure (IIIb-1) include, but are not limited to, styrene, 4-cyclohexylstyrene, 4-cyclohexylphenylacrylate, 4-cyclohexylphenylmethacrylate, 4-cyclopentylphenylacrylate, 4-cyclopentylphenylmethacrylate, 4-cycloheptylphenylacrylate, 4-cycloheptylphenylmethacrylate, 3-cyclohexylphenylacrylate, 3-cyclohexylphenylmethacrylate, 3-cyclopentylphenylacrylate, 3-cyclopentylphenylmethacrylate, 3-cycloheptylphenylacrylate, 3-cycloheptylphenylmethacrylate, 2-cyclohexylphenylacrylate, 2-cyclohexylphenylmethacrylate, 2-cyclopentylphenylacrylate, 2-cyclopentylphenylmethacrylate, 2-cycloheptylphenylacrylate, 2-cycloheptylphenylmethacrylate, 4-biphenylacrylate, 4-biphenylmethacrylate, 4-(4'-methylcyclohexyl)phenylacrylate, 4-(4'-methylcyclohexyl)phenylmethacrylate, 4-(3'-methylcyclohexyl)phenylacrylate, 4-(3'-methylcyclohexyl)phenylmethacrylate, 4-(4'-tert-butylcyclohexyl)phenylacrylate, 4-(4'-tert-butylcyclohexyl)phenylmethacrylate, 4-(4'-chlorocyclohexyl)phenylacrylate, 4-(4'-chlorocyclohexyl)phenylmethacrylate, and the like.

Another more preferred embodiment of the thermally curable Underlayer composition comprises a polymer comprising structures Ib, IIb, and IIIb-2

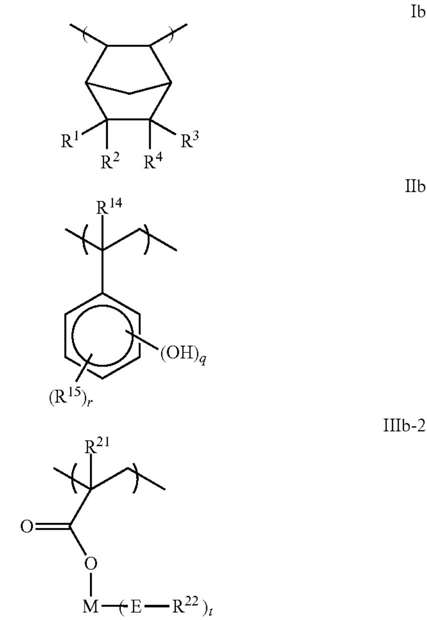

wherein Structures Ib and IIb are as defined above; M is a $C_6$-$C_{20}$ cycloalkylene group, $R^{21}$ is as defined for Structure III, E is a single bond or oxygen atom; $R^{22}$ represents a hydrogen atom, a substituted or unsubstituted, linear, branched or cyclic $C_1$-$C_6$ alkyl group or a substituted or unsubstituted alicyclic $C_5$-$C_{15}$ group; and t is an integer from 1 to about 2; and with the proviso that none of the repeating units of Structure Ib or IIb or IIIb-2 contain acid sensitive groups.

Illustrative examples of Structure (IIIb-2) generating monomers include, but are not limited to, cyclohexylacrylate, cyclohexylmethacrylate, cyclopentylacrylate, cyclopentylmethacrylate, cycloheptylacrylate, cycloheptylmethacrylate, bicyclo[2.1.1]hexylacrylate, bicyclo[2.1.1]hexylmethacrylate, bicyclo[2.2.1]heptylacrylate, isobornylacrylate, isobornylmethacrylate, adamantylacrylate, adamantylmethacrylate, 3-hydroxyadamantylmethacrylate, 3,5-dihydroxyadamantylmethacrylate, tricyclo[5,2,1,$0^{2,6}$]decylacrylate, tricyclo[5,2,1,$0^{2,6}$]decylmethylacrylate, 4-hydroxytricyclo[5.2.1.$0^{2,6}$]dec-8-yl 2-methylacrylate, 3,4-dihydroxytricyclo[5.2.1.$0^{2,6}$]dec-8-yl2-methylacrylate, tricyclo[5,2,1,$0^{2,6}$]decanemethylmethacrylate, tetracyclo[4,4,0,$1^{2,5}$.$1^{7,10}$]dodecanylacrylate, tetracyclo[4,4,0,$1^{2,5}$.$1^{7,10}$]dodecanylmethacrylate and the like.

The most preferred embodiment of the thermally curable Underlayer composition comprises a polymer comprising structures Ic, IIc, and IIIc.

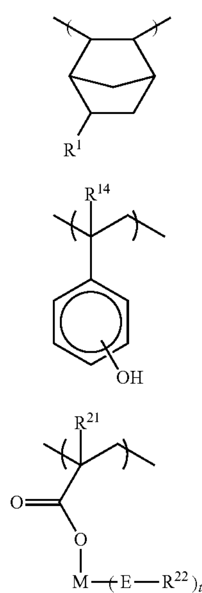

wherein $R^1$ represents a hydrogen atom, a halogen atom, a linear, branched or cyclic $C_1$-$C_6$ alkyl group, a halogenated or partially halogenated linear, branched or cyclic $C_1$-$C_6$ alkyl group, or a polar group represented by $(CH_2)_nR^5$ wherein $R^5$ is —OC(O)$R^{10}$, wherein $R^{10}$ represents a substituted or unsubstituted linear, branched or cyclic $C_1$-$C_6$ alkyl group and n is an integer of 0 or 1; $R^{14}$ represents a hydrogen atom or a methyl group; M is a $C_5$-$C_{20}$ cycloalkylene group, $R^{21}$ represents a hydrogen atom or a methyl group, E is a single bond or oxygen atom; $R^{22}$ represents a hydrogen atom, a substituted or unsubstituted linear branched or cyclic $C_1$-$C_6$ alkyl group or a substituted or unsubstituted alicyclic $C_5$-$C_{15}$ group; and t is an integer from 1 to about 2; and with the proviso that none of the repeating units of Structure Ic or IIc or IIIc contain acid sensitive groups.

Illustrative examples of Structure Ic generating monomers include, but are not limited to, bicyclo[2.2.1]hept-2-ene, 5-methylbicyclo[2.2.1]hept-2-ene, 5-ethyl bicyclo[2.2.1]hept-2-ene, 5-propyl bicyclo[2.2.1]hept-2-ene, 5-butyl bicyclo[2.2.1]hept-2-ene, 5-pentyl bicyclo[2.2.1]hept-2-ene, 5-hexyl bicyclo[2.2.1]hept-2-ene, 5-heptyl bicyclo[2.2.1]hept-2-ene, 5-octyl bicyclo[2.2.1]hept-2-ene, 5-decyl bicyclo[2.2.1]hept-2-ene, 5-dodecyl bicyclo[2.2.1]hept-2-ene, 5-phenyl bicyclo[2.2.1]hept-2-ene, 5-cyclohexyl bicyclo[2.2.1]hept-2-ene, 5-fluoro-bicyclo[2.2.1]hept-2-ene, 5-chloro bicyclo[2.2.1]hept-2-ene, bicyclo[2.2.1]hept-5-en-2-ol, bicyclo[2.2.1]hept-5-en-2-yl acetate, bicyclo[2.2.1]hept-5-en-2-yl methanol, bicyclo[2.2.1]hept-5-en-2-yl methyl acetate, bicyclo[2.2.1]hept-5-en-2-yl ethanol, bicyclo[2.2.1]hept-5-en-2-yl ethyl acetate, 5-(methoxymethyl)bicyclo[2.2.1]hept-2-ene, bicyclo[2.2.1]hept-5-en-2-yl bicyclo[2.2.1]heptane-2-carboxylate, bicyclo[2.2.1]hept-5-en-2-ylmethyl bicyclo[2.2.1]heptane-2-carboxylate, bicyclo[2.2.1]hept-5-en-2-yl bicyclo[2.2.1]hept-2-ylacetate, bicyclo[2.2.1]hept-5-en-2-ylmethyl bicyclo[2.2.1]hept-2-ylacetate, bicyclo[2.2.1]hept-5-en-2-yl 1-adamantylacetate, bicyclo[2.2.1]hept-5-en-2-yl adamantane-1-carboxylate, bicyclo[2.2.1]hept-5-en-2-ylmethyl 1-adamantylacetate, bicyclo[2.2.1]hept-5-en-2-ylmethyl adamantane-1-carboxylate, 3-chloro bicyclo[2.2.1]hept-2-ene, bicyclo[2.2.1]hept-5-ene-2-carboxylic acid, methyl bicyclo[2.2.1]hept-5-ene-2-carboxylate, 2-hydroxyethyl bicyclo[2.2.1]hept-5-ene-2-carboxylate, 2-(bicyclo[2.2.1]hept-5-en-2-yloxy)ethanol, 2-(bicyclo[2.2.1]hept-5-en-2-yloxy)ethanol, 2-(bicyclo[2.2.1]hept-5-en-2-yloxy)ethyl acetate and the like.

Illustrative examples of monomers generating Structure (IIc) after deprotection of the hydroxyl group include, but are not limited to 4-vinylphenyl acetate, 4-vinyl trimethylsiloxybenzene, 3-vinyl trimethylsiloxybenzene, 2-vinylphenyl acetate, 3-vinylphenyl acetate, 4-isopropenylphenyl acetate and the like.

Illustrative examples of monomers generating the repeating unit of Structure (IIIc) include, but are not limited to, cyclohexylacrylate, cyclohexylmethacrylate, cyclopentylacrylate, cyclopentylmethacrylate, cycloheptylacrylate, cycloheptylmethacrylate, bicyclo[2.1.1]hexylacrylate, bicyclo[2.1.1]hexylmethacrylate, bicyclo[2.2.1]heptylacrylate, isobornylacrylate, isobornylmethacrylate, adamantylacrylate, adamantylmethacrylate, 3-hydroxyadamantylmethacrylate, 3,5-dihydroxyadamantylmethacrylate, tricyclo[5,2,1,$0^{2,6}$]decylacrylate, tricyclo[5,2,1,$0^{2,6}$]decylmethylacrylate, 4-hydroxytricyclo[5.2.1.$0^{2,6}$]dec-8-yl 2-methylacrylate, 3,4-dihydroxytricyclo[5.2.1.$0^{2,6}$]dec-8-yl2-methylacrylate, tricyclo[5,2,1,$0^{2,6}$]decanemethylmethacrylate, tetracyclo[4,4,0,$1^{2,5}$.$1^{7,10}$]dodecanylacrylate, tetracyclo[4,4,0,$1^{2,5}$.$1^{7,10}$]dodecanylmethacrylate and the like.

The polymers used in this disclosure can be prepared from the corresponding monomers by any suitable conventional polymerization process. Such processes include, but are not limited to, free radical or controlled radical polymerizations. Such processes typically are run in a solvent or solvent mixture using a catalyst or initiator. Initiators should be chosen based on the temperature to be employed in the polymerization, which in turn may be set by the boiling point of the solvent. The temperature employed may depend on the monomer stability and the catalytic ability of the catalyst at the operating temperature, or by the decomposition half-life of the initiator.

The polymer can be prepared by copolymerizing a mixture of the three monomers in a suitable solvent or by successively adding a solution of monomers II and III to a solution of monomer I.

Suitable solvents which can be used for copolymerization include, but are not limited to, alcohols such as 2-propanol, propylene glycol monomethyl ether (PGME), 2-methoxyethanol; saturated carboxylic acid esters such as ethyl acetate, n-butyl acetate, methyl propionate, propylene glycol monomethyl ether acetate (PGMEA) and ethyl lactate (EL); alkyllactones such as γ-butyrolactone; ethers such as tetrahydrofuran, 2-methyl tetrahydrofuran, dimethoxyethanes, and diethoxyethanes; alkylketones such as 2-butanone, 2-heptanone (MAK), and methyl isobutyl ketone; cycloalkylketones such as cyclohexanone and the like. The solution concentration of monomer II and monomer III is preferably 20-60 wt % and the overall solution concentration of all monomers (I, II, III) is preferably 10-60 wt %. If the concentration is less than 10 wt %, the polymerization rate may be decreased. If the concentration exceeds 60 wt % the viscosity of the polymerization reaction solution may be too high, thus impeding proper mixing and making handling of the solution after the reaction completion difficult.

To copolymerize the monomers, a radical polymerization initiator is added to one of the monomer solutions described above and subsequent heating of the resulting mixture. In addition, a conventional chain transfer agent may also be added.

Examples of radical polymerization initiators which can be used in the preparation of the polymer include, but are not limited to, organic peroxides and azo compounds. Illustrative examples of organic peroxides include, but are not limited to, cyclohexanone peroxide, methylcyclohexanone peroxide, n-butyl-4,4-bis(t-butylperoxy)valerate, cumene hydroperoxide, isopropylbenzene peroxide, t-butylcumyl peroxide, lauroyl peroxide, benzoyl peroxide, bis(t-butylcyclohexyl)peroxydicarbonate, t-butyl peroxybenzoate and 2,5-dimethyl-2,5-di(benzoylperoxy)hexane and the like. Illustrative examples of azo compounds include, but are not limited to, methyl azobisisovalerate, 2,2-azobis(isobutyronitrile), 2,2-azobis(2,4-dimethylvaleronitrile), 2,2-azobis(4-methoxy-2,4-dimethylvaleronitrile), dimethyl-2,2-azobisisobutyrate, 4,4-azobis(4-cyanopentanoic acid), azobiscyclohexanecarbonitrile, 2,2-azobispropionitrile, 2,2-azobis(2-methylbutyronitrile), 1,1-azobis(cyclohexane-1-carbonitrile), and the like. The polymerization initiators may be used either individually or as a mixture of two or more. It is preferable to add the total necessary amount of the radical polymerization initiator to the monomer solution which is added successively. More preferably, the mixture of polymerization initiator is added to the solution of monomers type II and III which is then successively added to a solution of monomer type I.

In a preferred polymerization method the solution of monomer I is prepared in a reaction vessel brought to a temperature that enables copolymerization and maintained at that temperature while stirring. Typically the copolymerization temperature is between about 50° C. and about 120° C., and preferably this temperature is between about 70° C. and 100° C. The solution of initiator and monomers of type II and III (reactant solution) is then successively added to this reaction vessel to allow the monomers to be copolymerized. The solution may be added in various ways known to those skilled in the art. For example the reactant solution could be added continually with the use of a pump or addition funnel, or could be added in discrete aliquots over a period of several minutes to several hours depending on the method employed, the choice of initiator, reaction temperature, reactivity of the monomers and reaction scale.

The initiator is added in amounts suitable for initiation of the polymerization and to sustain the polymerization to the desired level of polymerization. Generally that is about 0.01 to about 10.0 mol % initiator to the total moles of monomers. The preferred amount of initiator to monomers is between about 0.01 to about 8.0 mol % and more preferred is an amount of about 0.5 to about 8.0 mol %.

Optionally, a chain transfer agent (e.g. carbon tetrabromide or 1-dodecanethiol) may be included. If used it is added in an amount of about 5 to about 50 wt % of the amount of initiator used. More preferred is an amount of about 10 to about 40 wt % of the initiator weight.

After completion of polymerization, the polymer solution may be concentrated by distillation whereby un-reacted monomers as well as some of the solvent are removed. Alternatively, the polymer may be isolated by precipitation into an appropriate amount of non-solvent, such as water, hexane, heptane, octane, petroleum ether, and combinations thereof. The precipitated polymer may be isolated by filtration and dried using conventional techniques known to those skilled in the art. The concentrated solution may be directly utilized for transesterification reaction, while the solid polymer will have to be re-dissolved into an appropriate solvent, such as those used to dissolve the monomers.

In the next step, the polymer solution is diluted with a suitable alcohol solvent. Illustrated examples of alcohol solvents include, but are not limited to, methyl alcohol, ethyl alcohol, propyl alcohol, butyl alcohol, 2-methoxy propanol and the like. The polymer is then subjected to transesterification conditions to remove protective groups (e.g. acetoxy) from the polymer in a solvent mixture containing the alcohol solvent in the presence of a catalytic amount of a transesterification catalyst. The catalyst selected will not substantially react with any alkyl acrylate monomeric units (if employed) or with any other functional groups in the polymer (see T. W. Greene, P. G. M. Wuts; Protective Groups in Organic Synthesis, 2nd Ed., 1991; pp 162-163). The catalyst is selected from the group consisting of ammonia, lithium methoxide, lithium ethoxide, lithium isopropoxide, sodium methoxide, sodium ethoxide, sodium isopropoxide, potassium methoxide, potassium ethoxide, potassium isopropoxide, cesium methoxide, cesium ethoxide, cesium isopropoxide, and combinations thereof, wherein the alkoxide anion is similar to the alcohol solvent. It is also understood that the catalyst can be an alkali metal hydroxide such as lithium hydroxide, sodium hydroxide, potassium hydroxide, cesium hydroxide and combinations thereof.

The amount of catalyst employed is from about 0.1 to about 5 mol % of protective groups in the composition of the polymer. Preferably, the catalyst is added in a second step as a solution in the alcohol solvent. The temperature in this second step is such that the transesterified by-product ester formed can be continually removed from the reaction mixture. Such temperatures can be from about 50° C. to about 150° C. The transesterification reaction can be carried out at the reflux temperature of the alcohol solvent. The procedure of alcoholysis may be similar to those procedures disclosed in U.S. Pat. No. 6,759,483 and PCT Patent Nos. WO 9957163 and WO 03089482.

In a third step, additional purification of the polymer can be done by treatment of the cold alcoholyzed polymer solution with a preferably strongly acidic cation exchange resin such as a sulfonated styrene/divinylbenzene cation exchange resin in hydrogen ion form. The procedure used in ion exchange resin treatment may be similar to those procedures disclosed in U.S. Pat. Nos. 5,284,930 and 5,288,850. In conjunction with the polymerization, precipitation/purification, transesterification and resin treatment steps, it is critical that all steps be conducted on an anhydrous basis, i.e. where the water level is less than about 5000 parts per million (ppm), in order to avoid possible side reactions and to provide a convenient and direct route to a resist composition without having to isolate the polymer again. If necessary, however, the polymer may be isolated by precipitation from the reaction medium by addition of the reaction medium to a non-solvent for the polymer such as water, hexane, heptane, octane, petroleum ether, and combinations thereof.

It is also within the scope of the present disclosure to optionally replace the precipitation step that follows the resin treatment, by diluting the polymer in the alcoholic solvent with an Underlayer composition compatible solvent such as those listed in the prior art set forth herein. Then the low boiling solvents (alcohol and water) are removed under reduced pressure. An example of such a solvent is PGMEA. Other solvents are well known in the art. In this manner, the resulting polymer solution can be used in the Underlayer composition without having to isolate and redissolve the polymer.

Each monomeric unit (Structure I, II, and III) is tailored to address specific properties of the Underlayer film. An underlayer composition needs to have high etch resistance, optimized absorbance, the ability to be crosslinked, have EBR compatibility and good film forming properties. Structure I is designed to improve the etch resistance of the polymer and has relatively low absorption at a λ of 193 nm. Incorporating Structure II into the polymer also improves etch resistance, provides hydroxyl groups for crosslinking and EBR compatibility, but has relatively high absorbance at a λ of 193 nm due to the aromatic group. Structure III can be chosen to refine the polymer's properties further and to improve the film forming ability of the Underlayer composition. Depending on pendent group selection and concentration of each of the monomeric units it is possible to design a polymer for a given exposure tool and application.

The polymers employed in the Underlayer composition have a weight average molecular weight (Mw) in terms of polystyrene from about 2000 to about 45,000. Polymers with Mw in terms of polystyrene from about 2,000 to about 30,000 are preferred. More preferred are polymers with Mw in terms of polystyrene from about 8,000 to about 20,000. The value of Mw can be determined by such standard methods as gel permeation chromatography as described, for example, in Jan Rabek, Experimental Methods in Polymer Chemistry, John Wiley&Sons, New York, 1983. The polydispersity (PDI) of the polymer may range from 1 to about 6. A preferred PDI of the polymer is from 1 to about 4. A more preferred PDI range for the polymer is from 1 to about 3

The polymers employed in the present disclosure are designed to provide substrate planarization and via filling capability to the Underlayer composition. Therefore, the glass transition temperature of the polymer should be below the temperature that may cause significant crosslinking of the Underlayer composition. The Tg of the polymer is governed by the selection and concentration of the monomeric units in the polymer and by the degree of polymerization. In general, increasing the concentration of Structure I in the polymer will increase the Tg of the polymer. Preferably, the Tg of the polymer for the Underlayer composition is about 10 to about 50° C. below the temperature that causes significant crosslinking. More preferably, the Tg of the polymer for the Underlayer composition is about 20 to about 40° C. below the temperature that causes significant crosslinking. The polymers used in the Underlayer composition generally have a Tg lower than 140° C.

The absorbance of the polymer is tuned by adjusting the concentration of the individual monomeric units in the polymer. It should be noted that the absorbance of a given polymer may be different at different wavelengths, requiring the optimization of a polymer for a particular wavelength of interest. Additionally, the monomeric unit choice and concentration is optimized for high etch selectivity, and compatibility with solvents.

The concentration of monomeric units in the polymer having Structure I may range from about 10 to about 35 mol %. A preferred concentration of Structure I is from about 15 to about 35 mol %. More preferred is a concentration of Structure I from about 15 to about 30 mol %. The most preferred concentration of monomeric units having Structure I is from about 20 to about 30 mol %. The concentration of monomeric units in the polymer having Structure II may range from about 10 to about 55 mol %. A preferred concentration of Structure II is from about 15 to about 50 mol %. More preferred is a concentration of Structure II from about 20 to about 45 mol %. The most preferred concentration of monomeric units having Structure II is from about 25 to about 45 mol %. The concentration of monomeric units in the polymer having Structure III may range from about 25 to about 60 mol %. A preferred concentration of Structure III is from about 25 to about 55 mol %. More preferred is a concentration of Structure III from about 30 to about 50 mol %. The most preferred concentration of monomeric units having Structure III is from about 30 to about 45 mol %.

The Underlayer composition further comprises one or more amino or phenolic crosslinking agents.

Any suitable amino or phenolic crosslinking agent may be used in the present application such as methylolated and/or methylolated and etherified guanamines, methylolated and/or methylolated and etherified melamines and the like. Examples of suitable melamine cross-linking agents are methoxyalkylmelamines such as hexamethoxymethylmelamine, trimethoxymethylmelamine, hexamethoxyethylmelamine, tetramethoxy-ethylmelamine, hexamethoxypropylmelamine, pentamethoxypropylmelamine, and the like. The preferred melamine cross-linking agent is hexamethoxymethyl-melamine. Preferred aminocrosslinking agents are MW100LM melamine crosslinker from Sanwa Chemical Co. Ltd., Kanaxawa-ken, Japan; Cymel 303, Cymel 1171, and Powderlink 1174 from Cytec Industries, West Patterson, N.J. Examples of suitable phenolic crosslinking agents are disclosed in U.S. Pat. Nos. 5,488,182 and 6,777,161 and US Patent application 2005/0238997. Specific examples of hydroxymethyl-substituted polyfunctional phenols used as crosslinker precursor are 4,4'[1,4-phenylenebis(methylidene)]bis(3,5-dihydroxymethyl phenol), 4,4'-[1,4-phenylenebis(1-ethylidene)]bis(3,5-dihydroxymethyl phenol), 4,4'-[1,4-phenylenebis(1-propylidene)]bis(3,5-dihydroxymethyl phenol), 4,4'-[1,4-phenylenebis(1-butylidene)]bis(3,5-dihydroxymethyl phenol), 4,4'-[1,4-phenylenebis(1-pentylidene)]bis(3,5-dihydroxymethyl phenol), 4,4'-[1,4-phenylenebis(1-methyl ethylidene)]bis(3,5-dihydroxymethyl phenol), 4,4'-[1,4-phenylenebis(1-ethyl propylidene)]bis(3,5-dihydroxymethyl phenol), 4,4'-[1,4-phenylenebis(1-propyl butylidene)]bis(3,5-dihydroxymethyl phenol), 4,4'-[1,4-phenylenebis(1-butyl pentylidene)]bis(3,5-dihydroxymethyl phenol), 4,4'-[1,3-phenylenebis(methylidene)]bis(3,5-dihydroxymethyl phenol), 4,4'-[1,3-phenylenebis(1-methyl ethylidene)]bis (3,5-dihydroxymethyl phenol), 4,4'-[1,3-phenylenebis(1-ethyl propylidene)]bis(3,5-dihydroxymethyl phenol), 4,4'-[1,3-phenylenebis(1-propyl butylidene)]bis(3,5-dihydroxymethyl phenol) and 4,4'-[1,3-phenylenebis(1-butyl pentylidene)]bis(3,5-dihydroxymethyl phenol) are given as specific examples of hydroxymethyl-substituted polyfunctional phenols as crosslinker precursor. Crosslinkers employed in this disclosure can be purchased commercially, or prepared by hydroxymethylation or alkoxymethylation of the corresponding phenols using standard techniques known to those skilled in the art. The preferred phenolic crosslinker is 4-[1-[4-[1,1-bis[4-hydroxy-3,5-bis(methoxymethyl)phenyl]ethyl]phenyl]-1-methylethyl]-2,6-bis(methoxymethyl)phenol available under the commercial name of CLR-19-MF from Honshu Chemical Industries Co. Ltd., Tokyo, Japan.

The Underlayer composition of the present disclosure further comprises one or more thermal acid generators (TAGs). TAGs useful in this disclosure are latent acid catalyst(s), which may be classified as either ionic or nonionic TAGs. For example the sulfonic esters of organic acids belong to the class of nonionic TAGs. Examples of nonionic sulfonate derivatives useful as TAGs include, but are not limited to, cyclohexyltosylate, 2-nitrobenzyl tosylate, 2-nitrobenzyl methylsulfonate, 2,6-dinitro benzyl p-toluenesulfonate, 4-dinitrobenzyl-p-toluenesulfonate, 1,2,3-tris(methane sulfonyloxy)benzene, 1,2,3-tris(methanesulfonyloxy)benzene, 1,2,3-tris(ethanesulfonyloxy)benzene, 1,2,3-tris(propanesulfonyloxy)benzene, 1,2,3-tris(trifluoromethane sulfonyloxy)benzene, 1,2,3-tris(p-toluene sulfonyloxy)benzene, 4-nitrobenzyl 9,10-dimethoxyanthracene-2-sulfonate and the like.

Suitable latent acid catalyst TAGs classified as ionic TAGs include organic acid salts represented by Structure IVa Structure IVa

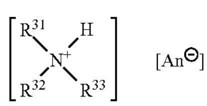

wherein $R^{31}$, $R^{32}$ and $R^{33}$ are independently a hydrogen atom, substituted or unsubstituted alkyl, substituted or unsubstituted cycloalkyl, substituted or unsubstituted alicyclic, partially or completely halogen substituted alkyl, substituted or unsubstituted aryl, substituted or unsubstituted alkoxy groups, or any two of $R^{31}$, $R^{32}$ and $R^{33}$ or all of $R^{31}$, $R^{32}$ and $R^{33}$ are part of a cyclic or polycyclic group which may contain an oxygen, sulfur or nitrogen hetero atom; $An^-$ is selected from the group consisting of sulfonates of substituted or unsubstituted $C_1$-$C_{12}$ alkyl, partially or completely halogen substituted $C_1$-$C_{12}$ alkyl, $C_4$-$C_{15}$ cycloalkyl, partially or completely halogen substituted $C_4$-$C_{15}$ cycloalkyl, $C_7$-$C_{20}$ alicyclic or $C_6$-$C_{20}$ aromatic groups; disulfonates of substituted or unsubstituted $C_1$-$C_{12}$ alkylene, partially or completely halogen substituted $C_1$-$C_{12}$ alkylene, $C_4$-$C_{15}$ cycloalkylene, partially or completely halogen substituted $C_4$-$C_{15}$ cycloalkylene, $C_7$-$C_{20}$ alicyclic or $C_6$-$C_{20}$ aromatic groups; sulfonamides of Structure Va Structure Va

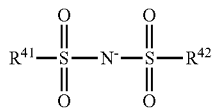

wherein $R^{41}$ and $R^{42}$ are independently substituted or unsubstituted alkyl, substituted or unsubstituted cycloalkyl, substituted or unsubstituted alicyclic, partially or completely halogen substituted alkyl, or substituted or unsubstituted aryl groups; and methides of Structure Vb Structure Vb

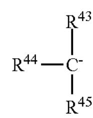

wherein $R^{43}$, $R^{44}$ and $R^{45}$ are independently $C_1$-$C_{10}$ perfluoroalkylsulfonyl groups.

Suitable examples of amines which can be used to generate the ammonium ion include, but are not limited to, tributylamine, triisobutylamine, dicyclohexylamine, N-ethyldicyclohexylamine, 1-methylpyrrolidine, 1-butylpyrrolidine, piperidine, 1-methylpiperidine, hexamethyleneimine, heptamethyleneimine, tropane, quinuclidine, 4-methyl-1-oxa-3-aza-cyclopentane, 4,4-dimethyl-1-oxa-3-aza-cyclopentane, 4,4-diethyl-1-oxa-3-aza-cyclopentane, 4,4-diisopropyl-1-oxa-3-aza-cyclopentane, 4,4-ditert-butyl-1-oxa-3-aza-cyclopentane, 4,4-dimethyl-1-oxa-3-aza-cyclohexane, 1-aza-3,7-dioxa-5-ethylbicyclo[3.3.0]octane, 1-aza-3,7-dioxa-5-methylbicyclo[3.3.0]octane, 1-aza-3,7-dioxa-5-tertbutylbicyclo[3.3.0]octane and the like. Examples of suitable TAGs of this type can be found in U.S. Pat. Nos. 3,474,054, 4,200,729, 4,251,665, and 5,187,019 herein incorporated by reference.

Another suitable type of latent acid catalyst classified as an ionic TAG are benzylammonium salts of acids represented by Structure IVb and IVc Structure IVb

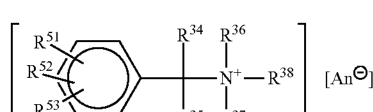

Structure IVc

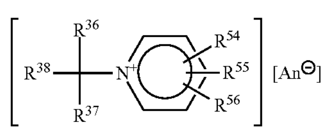

wherein $R^{34}$ and $R^{35}$ are independently hydrogen, alkyl or halogen groups; $R^{36}$ and $R^{37}$ are independently $C_1$-$C_{10}$ alkyl or alkoxy groups; $R^{38}$ is a phenyl group; $R^{51}$, $R^{52}$, $R^{53}$, $R^{54}$, $R^{55}$ and $R^{56}$ are independently hydrogen, alkyl or halogen groups and $An^-$ has the same meaning as defined above.

Suitable examples of benzylic amines which can be used to generate the ammonium ion include, but are not limited to, N-(4-methoxybenzyl)-N,N-dimethylaniline, N-(benzyl)-N,N-dimethylaniline, N-(benzyl)-N,N-dimethyltoluidine, N-(4-methylbenzyl)-N,N-dimethylaniline, N-(4-methoxybenzyl)-N,N-dimethylaniline, N-(4-chlorobenzyl)-N,N-dimethylaniline, N-(t-butylbenzyl)-dimethylpyridine and the like. Examples of this class of ionic TAG may be found in U.S. Pat. Nos. 5,132,377, 5,066,722, 6,773,474 and U.S. publication 2005/0215713, herein incorporated by reference.

The TAGs useful for the disclosure are those compounds capable of generation of free acid at the bake temperature of the films formed from the Underlayer composition. Typically these temperatures range from about 90° C. to about 250° C. Preferably the TAG will have a very low volatility at temperatures between 170-220° C. TAGs employed in this disclosure can be purchased commercially (e.g. from King Industries, Norwalk, Conn. 06852, USA), prepared by published synthetic procedures or synthetic procedures known to those skilled in the art.

The thermal acid generators described above should not be considered photoacid generators. Any sensitivity that the thermal acid generators may have to UV light should be very poor and they cannot practically be used in photolithography as photoacid generators.

Suitable solvents for the Underlayer composition include alcohols, ketones, ethers and esters, such as 1-pentanol, propyleneglycol monomethyl ether (PGME), 2-heptanone, cyclopentanone, cyclohexanone, γ-butyrolactone, ethylene glycol monomethyl ether, ethylene glycol monoethyl ether, 2-methoxyethyl acetate, ethylene glycol monoethyl ether acetate (PGMEA), propylene glycol monoethyl ether, propylene glycol methyl ether acetate, methyl lactate, ethyl lactate, methyl 3-methoxypropionate, ethyl ethoxypropionate, methyl pyruvate, ethyl pyruvate, propyl pyruvate, N-methyl-2-pyrrolidone, ethylene glycol monoisopropyl ether, diethylene glycol monoethyl ether, diethylene glycol dimethyl ether and the like. The more preferred solvents for the Underlayer composition are 2-heptanone, propylene glycol monomethyl alcohol, propylene glycol methyl ether acetate, ethyl lactate and mixtures thereof.

The thermally curable Underlayer compositions contain on a total solids basis about 65 to about 95 wt %, preferably about 70 to about 95 wt %, and more preferably about 72 to about 95 wt % of the polymer comprising structures I, II and III. The amount of the cross-linking agent in the thermally curable Underlayer compositions on a total solids basis is from about 3 to about 30 wt %, preferably from about 3 to about 27 wt % and more preferably from about 3 to about 25 wt %. The amount of the thermal acid generator in the thermally curable Underlayer compositions is on a total solids basis from about 0.1 to about 5 wt %, preferably from about 0.2 to about 4 wt % and more preferably from about 0.2 to about 3 wt %. The amount of solid in the thermally curable Underlayer compositions is from about 2 to about 40 wt %, preferably from about 3 to about 20 wt % and more preferably from about 4 to about 15 wt %.

It should be noted that formulation and process optimization is necessary to get optimum results. For example the amount of crosslinking agent needed may vary depending on the polymer composition used and the Underlayer film curing temperature of the coating process. In general lower crosslinking agent concentrations may be needed with higher Underlayer film curing temperatures. The type and concentration of the TAG, especially in regard to TAG effectiveness also need to be considered. The selection of the solvent system is also critical. The solvent or solvent blend needs to be compatible with the polymer used and also with the substrate to prevent coating defects.

Optionally the Underlayer composition may contain a surfactant or a blend of one or more surfactants. Suitable types of surfactants include, but are not limited to, nonionic surfactants, fluorine, silicon or fluorine and silicon containing surfactants.

Examples of the surfactants include the surfactants described in Patent Nos. JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988.

Examples of non-ionic surfactants include, but are not limited to, polyoxyethylene alkyl ethers such as polyoxyethylene lauryl ether, polyoxyethylene stearyl ether, polyoxyethylene cetyl ether and polyoxyethylene oleyl ether, polyoxyethylene alkyl allyl ethers such as polyoxyethylene octyl phenol ether and polyoxyethylene nonyl phenol ether, polyoxyethylene-polyoxypropylene block copolymers, sorbitol fatty acid esters such as sorbitol monolaurate, sorbitol monopalmitate, sorbitol monostearate, sorbitol monooleate, sorbitol trioleate and sorbitol tristearate, and polyoxyethylene sorbitol fatty acid esters such as polyoxyethylene sorbitol monolaurate, polyoxyethylene sorbitol monopalmitate, polyoxyethylene sorbitol monostearate, polyoxyethylene sorbitol trioleate and polyoxyethylene sorbitol tristearate.

Commercially available fluorine containing or silicon containing surfactants include, but are not limited to, Eftop EF301, EF303 (produced by Shin-Akita Kasei K.K.), Megafac F171, F173, F176, F189, R08 (produced by Dainippon Ink & Chemicals Inc.), Surflon S-382, SC101, 102, 103, 104, 105, 106 (produced by Asahi Glass Co., Ltd.) and Troysol S-366 (produced by Troy Chemical K.K.). Polysiloxane polymer KP-341 (produced by Shin-Etsu Chemical Co., Ltd.) can also be used as the silicon-containing surfactant.

If a surfactant is employed it is added from about 0.001 to about 2 wt % and preferably from about 0.01 to about 1 wt % based on the solid content of the Underlayer composition.

The index of refraction n at the exposing wavelength of the thermally cured Underlayer film is preferably more than or equal to 1.55 and less than or equal to 1.80. More preferably n is in the range of about 1.60 to about 1.70. The most preferred n of the Underlayer film is about the same as the n of the imaging layer employed. The extinction coefficient k, of the Underlayer film at the exposing wavelength is more than or equal to 0.05 and less than or equal to 0.50. A preferred k is from 0.10 to 0.42. More preferably, k is in the range from 0.20 to 0.40. A k of 0.15 to 0.29 is most preferred to provide a satisfactory antireflection effect at a film thickness of 150 nm or greater.

The thermally curable Underlayer composition of the present disclosure should not undergo significant crosslinking until it reaches a temperature of about 50° C. Significant crosslinking below 50° C. may lead to gel formation at room temperature, which will reduce its shelf life. Gel formation results in non-uniform coatings and if used in lithography, will result in poor line width control in the imaged features.

The present disclosure also relates to a photolithographic bilayer coated substrate comprising: a substrate, a film of the thermally cured Underlayer composition as described above coated on the substrate and a radiation-sensitive chemically amplified resist coated over the thermally cured Underlayer composition.

The substrate may be, for example, semiconductor materials such as a silicon wafer, compound semiconductor (III-V) or (II-VI) wafer, a ceramic, glass or quartz substrate. Said substrates may also contain films or structures used for electronic circuit fabrication such as organic or inorganic dielectrics, copper or other wiring metals.

The resist may be any suitable radiation-sensitive resist. It is typically a chemically amplified resist sensitive to radiation in the deep UV region such as those discussed in U.S. Pat. Nos. 5,492,793 and 5,747,622, which are incorporated herein by reference. Preferably, for a bilayer resist system, the radiation-sensitive resist will contain silicon to protect it from oxygen plasma etching. Examples of suitable chemically amplified resists contain an alkali solubilizing group blocked by an acid sensitive group. Examples of suitable alkali solubilizing groups include, but are not limited to, carboxylic acids, phenols, hydroxyimides, hydroxymethylimides, fluorinated alcohols and silanols. Examples of suitable blocking groups include, but are not limited to, alkyl groups containing tertiary carbons, and alpha alkoxy alkyls, and arylisopropyl groups. Examples of suitable blocked alkali solubilizing groups include, but are not limited to, t-butyl esters, alpha alkoxy esters, alpha alkoxyalkyl aromatic ethers, t-butoxyphenyl, t-butoxyimido, and t-butoxymethylimido. Examples of blocked alkali solubilizing groups can be found in U.S. Pat. Nos. 5,468,589, 4,491,628, 5,679,495, 6,379,861, 6,329,125, and 5,206,317, which are incorporated herein by reference.

Suitable polymers for the resist for the imaging layer are those which contain both silicon and blocked alkali solubilizing groups. Suitable polymers are those with silicon content of about 5 to about 30% silicon by weight. Preferred polymers are those with silicon content from about 8 to about 25% silicon by weight. Examples of suitable resist polymers can be found in U.S. Pat. Nos. 6,146,793, 6,165,682, 6,340,734, 6,028,154, 6,042,989, 5,882,844, 5,691,396, 5,731,126, 5,985,524, 6,916,543 and 6,929,897, which are incorporated herein by reference. Other suitable polymers are disclosed in U.S. Pat. Nos. 6,531,260 and 6,590,010, which are incorporated herein by reference. The silicon content may be contained in the polymer before coating as in the above references or the polymer may be silylated after coating as in U.S. Pat. Nos. 6,306,990 and 6,110,637, which are incorporated herein by reference.

The radiation-sensitive resist will also contain a photoacid generating (PAG) compound.

Any suitable photoacid generator compounds may be used in the radiation sensitive resist. The photoacid generator compounds are well known and include, for example, onium salts such as diazonium, sulfonium, sulfoxonium and iodonium salts, nitrobenzylsulfonate esters, oximesulfonates, imidosulfonates and disulfones. Suitable photoacid generator compounds are disclosed, for example, in U.S. Pat. Nos. 5,558,978, 5,468,589, 5,554,664 and 6,261,738, which are incorporated herein by reference. U.S. Pat. No. 6,261,738 discloses examples of suitable oximesulfonate PAGs. Other suitable photoacid generators are perfluoroalkyl sulfonyl methides and perfluoroalkyl sulfonyl imides as disclosed in U.S. Pat. No. 5,554,664.

Suitable examples of photoacid generators are phenacyl p-methylbenzenesulfonate, benzoin p-toluenesulfonate, α-(p-toluene-sulfonyloxy)methylbenzoin, 3-(p-toluene-sulfonyloxy)-2-hydroxy-2-phenyl-1-phenylpropyl ether, N-(p-dodecylbenzenesulfonyloxy)-1,8-naphthalimide and N-(phenyl-sulfonyloxy)-1,8-napthalimide.

Examples of suitable onium salts included but are not limited to, triphenyl sulfonium bromide, triphenyl sulfonium chloride, triphenyl sulfonium iodide, triphenyl sulfonium methane sulfonate, triphenyl sulfonium trifluoromethanesulfonate, triphenyl sulfonium hexafluoropropanesulfonate, triphenyl sulfonium nonafluorobutanesulfonate, triphenyl sulfonium perfluorooctanesulfonate, triphenyl sulfonium phenyl sulfonate, triphenyl sulfonium 4-methyl phenyl sulfonate, triphenyl sulfonium 4-methoxyphenyl sulfonate, triphenyl sulfonium 4-chlorophenyl sulfonate, triphenyl sulfonium camphorsulfonate, 4-methylphenyl-diphenyl sulfonium trifluoromethanesulfonate, bis(4-methylphenyl)-phenyl sulfonium trifluoromethanesulfonate, tris-4-methylphenyl sulfonium trifluoromethanesulfonate, 4-tert-butylphenyl-diphenyl sulfonium trifluoromethanesulfonate, 4-methoxyphenyl-diphenyl sulfonium trifluoromethanesulfonate, mesityl-diphenyl sulfonium trifluoromethanesulfonate, 4-chlorophenyl-diphenyl sulfonium trifluoromethanesulfonate, bis(4-chlorophenyl)-phenyl sulfonium trifluoromethanesulfonate, tris(4-chlorophenyl)sulfonium trifluoromethanesulfonate, 4-methylphenyl-diphenyl sulfonium hexafluoropropanesulfonate, bis(4-methylphenyl)-phenyl sulfonium hexafluoropropanesulfonate, tris-4-methylphenyl sulfonium hexafluoropropanesulfonate, 4-tert-butylphenyl-diphenyl sulfonium hexafluoropropane sulfonate, 4-methoxyphenyl-diphenyl sulfonium hexafluoropropane sulfonate, mesityl-diphenyl sulfonium hexafluoropropane sulfonate, 4-chlorophenyl-diphenyl sulfonium hexafluoropropane sulfonate, bis(4-chlorophenyl)-phenyl sulfonium hexafluoropropane sulfonate, tris(4-chlorophenyl) sulfonium hexafluoropropane sulfonate, 4-methylphenyl-diphenyl sulfonium perfluorooctanesulfonate, bis(4-methylphenyl)-phenyl sulfonium perfluorooctanesulfonate, tris-4-methylphenyl sulfonium perfluoroocatanesulfonate, 4-tert-butylphenyl-diphenyl sulfonium perfluorooctane sulfonate, 4-methoxyphenyl-diphenyl sulfonium perfluorooctane sulfonate, mesityl-diphenyl sulfonium perfluorooctane sulfonate, 4-chlorophenyl-diphenyl sulfonium perfluorooctane sulfonate, bis(4-chlorophenyl)-phenyl sulfonium perfluorooctane sulfonate, tris(4-chlorophenyl)sulfonium perfluorooctane sulfonate, diphenyl iodonium hexafluoropropane sulfonate, diphenyl iodonium 4-methylphenyl sulfonate, bis (4-tert-butylphenyl)iodonium trifluoromethane sulfonate, bis (4-tert-butylphenyl)iodonium hexafluoromethane sulfonate, and bis(4-cyclohexylphenyl)iodonium trifluoromethane sulfonate.

Further examples of suitable photoacid generators for use in this disclosure are bis(p-toluenesulfonyl)diazomethane, methylsulfonyl p-toluenesulfonyldiazomethane, 1-cyclohexylsulfonyl-1-(1,1-dimethylethylsulfonyl)diazomethane, bis(1,1-dimethylethylsulfonyl)diazomethane, bis(1-methylethylsulfonyl)diazomethane, bis(cyclohexylsulfonyl)diazomethane, 1-p-toluenesulfonyl-1-cyclohexylcarbonyldiazomethane, 2-methyl-2-(p-toluenesulfonyl)propiophenone, 2-methanesulfonyl-2-methyl-(4-methylthiopropiophenone, 2,4-methyl-2-(p-toluenesulfonyl)pent-3-one, 1-diazo-1-methylsulfonyl-4-phenyl-2-butanone, 2-(cyclohexylcarbonyl-2-(p-toluenesulfonyl)propane, 1-cyclohexylsulfonyl-1-cyclohexylcarbonyldiazomethane, 1-diazo-1-cyclohexylsulfonyl-3,3-dimethyl-2-butanone, 1-diazo-1-(1,1-dimethylethylsulfonyl)-3,3-dimethyl-2-butanone, 1-acetyl-1-(1-methylethylsulfonyl)diazomethane, 1-diazo-1-(p-toluenesulfonyl)-3,3-dimethyl-2-butanone, 1-diazo-1-benzenesulfonyl-3,3-dimethyl-2-butanone, 1-diazo-1-(p-toluenesulfonyl)-3-methyl-2-butanone, cyclohexyl 2-diazo-2-(p-toluenesulfonyl)acetate, tert-butyl 2-diazo-2-benzenesulfonylacetate, isopropyl-2-diazo-2-methanesulfonylacetate, cyclohexyl 2-diazo-2-benzenesulfonylacetate, tert-butyl 2 diazo-2-(p-toluenesulfonyl)acetate, 2-nitrobenzyl p-toluenesulfonate, 2,6-dinitrobenzyl p-toluenesulfonate, 2,4-dinitrobenzyl p-trifluoromethylbenzenesulfonate.

The photoacid generator compound is typically employed in the amounts of about 0.0001 to 20% by weight of polymer solids and more preferably about 1% to 10% by weight of polymer solids.

Suitable solvents for the radiation sensitive resists for the imaging layer include ketones, ethers and esters, such as methyl ethyl ketone, methyl isobutyl ketone, 2-heptanone, cyclopentanone, cyclohexanone, 2-methoxy-1-propylene acetate, 2-methoxyethanol, 2-ethoxyethanol, 2-ethoxyethyl acetate, 1-methoxy-2-propyl acetate, 1,2-dimethoxy ethane ethyl acetate, cellosolve acetate, propylene glycol monoethyl ether acetate, propylene glycol methyl ether acetate, methyl lactate, ethyl lactate, methyl pyruvate, ethyl pyruvate, ethyl 3-methoxypropionate, N-methyl-2-pyrrolidone, 1,4-dioxane, ethylene glycol monoisopropyl ether, diethylene glycol monoethyl ether, diethylene glycol monomethyl ether, diethylene glycol dimethyl ether, and the like. The solvents employed in the radiation sensitive resists for the imaging layer will be chosen with a view toward compatibility with the polymer in the Underlayer film and the components of the radiation sensitive resists. For example, the choice of solvent for the radiation sensitive resist and the concentration thereof depends principally on the type of functionalities incorporated in the acid labile polymer, the photoacid generator, and the coating method. The solvent should be inert, should dissolve all the components in the resist, should not undergo any chemical reaction with the components and should be removable on drying after coating.

Additionally, base additives may be added to the radiation sensitive resist. The purpose of the base additive is to scavenge protons present in the resist prior to being irradiated by the actinic radiation. The base prevents attack and cleavage of the acid labile groups by the undesirable acids, thereby increasing the performance and stability of the resist. In addition, the base can act as a diffusion control agent to prevent the acid from migrating too far and lower resolution. The percentage of base in the composition should be significantly lower than the photoacid generator or otherwise the photosensitivity becomes too low. The preferred range of the base compounds, when present, is about 3% to 50% by weight of the photoacid generator compound. Nitrogenous bases are preferred. Suitable examples of base additives are cyclopropylamine, cyclobutylamine, cyclopentylamine, dicyclopentylamine, dicyclopentylmethylamine, dicyclopentylethylamine, cyclohexylamine, dimethylcyclohexylamine, dicyclohexylamine, dicyclohexylmethylamine, dicyclohexylethylamine, dicyclohexylbutylamine, cyclohexyl-t-butylamine, cycloheptylamine, cyclooctylamine, 1-adamantanamine, 1-dimethylaminoadamantane, 1-diethylaminoadamantane, 2-adamantanamine, 2-dimethylaminoadamantane, 2-aminonorbornene, 3-noradamantanamine, 2-methylimidazole, tetramethyl ammonium hydroxide, tetrabutylammonium hydroxide, triisopropylamine, 4-dimethylaminopryidine, 4,4'-diaminodiphenyl ether, 2,4,5-triphenylimidazole, 1,5-diazabicyclo[4.3.0]non-5-ene, 1,8-diazabicyclo[5.4.0]undec-7-ene, guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, trimethylimidazole, triphenylimidazole, and methyldiphenylimidazole. However, the basic compounds should not be construed as being limited to these examples.

Dyes may be added to the resist to increase the absorption of the composition to the actinic radiation wavelength. The dye must not poison the composition and must be capable of withstanding the process conditions including any thermal treatments. Examples of suitable dyes are fluorenone derivatives, anthracene derivatives or pyrene derivatives. Other specific dyes that are suitable for radiation sensitive resists are described in U.S. Pat. No. 5,593,812.

The radiation sensitive resist may further comprise conventional additives such as adhesion promoters and surfactants. A person skilled in the art will be able to choose the appropriate desired additive and its concentration.

The Underlayer film in the bilayer stack is present at a thickness necessary to enable the lithographic patterning of the imaging layer and to provide enough protection to the substrate for its subsequent treatment (i.e. etching). Preferably the Underlayer film thickness is from about 120 nm to about 1200 nm. A more preferred Underlayer film thickness range is from about 150 nm to about 500 nm. The preferred Underlayer film thickness is from 160 nm to 300 nm.

The imaging layer thickness in the bilayer stack is optimized for lithographic performance, and the need to provide oxygen plasma etch resistance for the image transfer into the Underlayer film. Preferably the imaging layer has a thickness from about 80 nm to about 500 nm. A more preferred imaging layer thickness range is from about 100 nm to about 250 nm. The preferred imaging layer thickness is from 110 nm to 170 nm.

Any suitable method to apply the film of the thermally cured Underlayer composition over the substrate and the radiation-sensitive chemically amplified resist over the thermally cured Underlayer composition may be used. Coating methods include, but are not limited to, spray coating, spin coating, offset printing and the like. Coatings are then dried and/or cured in a baking step employing hot plates or various types of ovens known to those skilled in the art. More detailed coating and drying methods are described in the paragraphs below discussing the novel process employing the bilayer stack.

The disclosure further relates to a process for forming a pattern on a substrate which comprises the following process steps:

(a) providing a substrate;

(b) coating in a first coating step said substrate with a thermally curable Underlayer composition of this disclosure;

(c) curing said Underlayer composition to provide an Underlayer film;

(d) coating in a second coating step a silicon containing radiation sensitive resist over the Underlayer film;

(e) baking the silicon containing radiation sensitive resist in a second baking step;

(f) exposing the bilayer resist stack to radiation;

(g) developing a portion of the silicon containing radiation sensitive resist of the bilayer resist stack and uncovering a portion of the underlying Underlayer film;

(h) rinsing the bilayer resist stack; and (i) etching the uncovered Underlayer film in oxidizing plasma to produce a bilayer relief image.

For this process, the substrates and resist are as described previously for the bilayer stack.

In the first coating step (b), the Underlayer composition may be applied uniformly to a suitable substrate by known coating methods. Coating methods include, but are not limited to spray coating, spin coating, offset printing, roller coating, screen printing, extrusion coating, meniscus coating, curtain coating, dip coating, and immersion coating.

After the first coating step, the tacky film of Underlayer composition is baked in a first bake step (c). The baking may take place at one temperature or multiple temperatures in one or more steps. Baking may take place on a hot plate or in various types of ovens known to those skilled in the art. Suitable ovens include ovens with thermal heating, vacuum ovens with thermal heating, and infrared ovens or infrared track modules. Typical times employed for baking will depend on the chosen baking means and the desired time and temperature and will be known to those skilled in the art. A preferred method of baking is on a hot plate. When baking on a hot plate employing a two step process, typical times range from about 0.5 minutes to about 5 minutes at temperatures typically between about 80° C. to 130° C., followed by a cure step for about 0.5 minutes to about 5 minutes typically between about 170° C. to about 250° C. In a one step process, the Underlayer film is cured for about 0.5 minutes to about 5 minutes typically between about 170° C. to about 250° C. The Underlayer film coated substrate is then allowed to cool. Preferably, the thermally curable Underlayer composition is cured at temperatures between about 180° C. to about 250° C. and more preferably between temperatures of 190° C. to 220° C. The preferable cure times are from about 30 to 180 seconds and more preferably from about 60 to about 120 seconds. Typical film thickness may range from about 120 nm to about 1200 nm.

In a second coating step (d), the Underlayer film-coated substrate is then coated with a resist and, in a second baking step (e), baked. Coating and baking equipment described above for the Underlayer film may be employed. Typical times employed for baking will depend on the chosen baking means, the particular resist, the desired time and the desired temperature and will be known to those skilled in the art. A preferred method of baking is on a hot plate. When baking on a hot plate, typical times range from about 0.5 minutes to about 5 minutes at temperatures typically between about 80° C. to about 140° C. Optimum bake parameters may vary depending on the resist and solvent employed. Typical resist film thickness may range from about 80 nm to about 500 nm.

For the production of relief structures, the radiation-sensitive resist is imagewise exposed to actinic radiation (f). The term 'imagewise' exposure includes both exposure through a photomask containing a predetermined pattern, exposure by means of any suitable source of actinic radiation, such as for example, a computer controlled laser beam which is moved over the surface of the coated substrate, exposure by means of computer-controlled electron beams, and exposure by means of X-rays or UV rays, through a corresponding mask. The imagewise exposure generates acid in the exposed regions of the resist which catalyzes the cleavage of the acid labile groups resulting in a polymer which is aqueous soluble.

The process described above for the production of relief structures preferably includes, as a further process measure, heating of the coating between exposure and treatment with the developer. With the aid of this heat treatment, known as "post-exposure bake", virtually complete reaction of the acid labile groups in the polymer with the acid generated by the exposure is achieved. The duration and temperature of this post-exposure bake can vary within broad limits and depend essentially on the functionalities of the polymer, the type of acid generator and on the concentration of these two components. The exposed resist is typically subjected to temperatures of about 50° C. to about 150° C. for a few seconds to a few minutes. The preferred post exposure bake is from about 80° C. to 130° C. for about 5 seconds to 180 seconds. Any suitable heating means may be employed. The preferred heating means is a hot plate.

After imagewise exposure and any heat treatment of the material, the exposed areas of the resist are removed by dissolution in an aqueous base developer to generate a relief Structure (g). Examples of suitable bases include, but are not limited to, inorganic alkalis (e.g., potassium hydroxide, sodium hydroxide, ammonia water), primary amines (e.g., ethylamine, n-propylamine), secondary amines (e.g. diethylamine, di-n-propylamine), tertiary amines (e.g., triethylamine), alcoholamines (e.g. triethanolamine), quaternary ammonium salts (e.g., tetramethylammonium hydroxide, tetraethylammonium hydroxide), and mixtures thereof. The concentration of base employed will vary depending on the base solubility of the polymer employed and the specific base employed. The most preferred developers are those containing tetramethylammonium hydroxide (TMAH). Suitable concentrations of TMAH range from about 1 wt % to about 5 wt %. In addition, an appropriate amount of a surfactant can be added to the developer.

Development can be carried out by means of immersion, spray, puddling, or other similar developing methods known to those skilled in the art at temperatures from about 10° C. to 40° C. for about 30 seconds to about 5 minutes with or without agitation. After development, the relief pattern may be optionally rinsed with a rinse comprising de-ionized water or comprising de-ionized water containing one or more surfactants and dried by spinning, baking on a hot plate, in an oven, or other suitable means.

The radiation-sensitive resist used for the imaging layer of the bilayer process described above will typically contain silicon or have silicon incorporated into the resist after development. After images are formed in the imaging layer, the imaged substrate will be placed in a plasma-etching environment comprising oxygen so that the Underlayer film will be removed in the area uncovered by the removal of resist. This operation is carried out by gas plasma etching using the pattern of the above-mentioned imaging layer as a mask, thereby forming a micro pattern. Etch gas mixtures for plasma etching organic ARC materials or Underlayer films are disclosed in U.S. Pat. Nos. 5,773,199, 5,910,453, 6,039,888, 6,080,678, and 6,090,722. Of these, the '199 patent discloses a gas mixture of $CHF_3+CF_4+O_2+Ar$; the '453 patent discloses gas mixtures of $N_2+He+O_2$ or $N_2+O_2$ or $N_2+He$; the '888 discloses a gas mixture of $O_2+CO$; the '678 patent discloses a gas mixture of $O_2+SO_2$; and the '722 patent discloses a gas mixture of $C_2F_6+Ar$. The silicon incorporated in the radiation-sensitive resist forms silicon dioxide when exposed to oxygen plasma and protects the resist from being etched so that relief structures can be formed in the Underlayer film.

After the oxygen plasma step, the substrate carrying the bilayer relief structure is generally subjected to at least one further treatment step, which changes the substrate in areas not covered by the bilayer coating. Typically, this can be implantation of a dopant, deposition of another material on the substrate or etching of the substrate. This is usually followed by the removal of the resist coating from the substrate typically by a fluorine/oxygen plasma etch.

The disclosure is illustrated by, but not limited to, the following examples in which the parts and percentages are by weight unless otherwise specified.

General Analytical Methods for Analysis of Polymers

Molecular weight (Mw) and molecular weight distribution data (polydispersivity (PDI)) were measured by Gel Permeation Chromatography (GPC) using a Waters Corp. liquid chromatograph equipped with Millennium GPC V software, refractive index detection, 4 GPC Columns and a guard column from Phenomenex (Phenogel-10 $10^4$, 500, 100, & 50 Å (all 7.8 mm ID×300 mm)) and Phenogel-10 guard 7.8×50 mm), using tetrahydrofuran (THF) eluent and polystyrene calibration. Thermal decomposition measurements were performed using a Perkin-Elmer TGA-7 thermal gravimetric analyzer (TGA) at a heating rate of 10° C./minute. Glass transition temperatures (Tg) were determined using a Perkin-Elmer Pyris-1 differential scanning calorimeter at a heating rate of 10° C./minute. The structure and composition data were determined with $^1H$ and $^{13}C$ NMR spectrometry using a Bruker Advance 400 MHz nuclear magnetic resonance spectrometer.

General Procedure for Measurement of Optical Constants n and k

The n&k 1200 analyzer from n&k Technologies was used to determine the optical film constants n and k of the thermally curable Underlayer coatings. A 4 inch silicon wafer was spin coated with a thermally curable Underlayer and post apply baked at 205° C. for 90 seconds giving a 1600 Å film thickness. A clean 4 inch bare silicon wafer was used for baseline reflectance measurement. Then, the reflectance spectrum (R) of the cured film was measured in the range of 190-900 nm on the n&k Analyzer 1200 tool using DUV, Visible and NIR sources. n and k values of the film at 193 nm were calculated from the reflectance spectrum by software provided by the tool maker with a very high goodness fit. The software utilizes the Forouhi-Bloomer formulation model described in U.S. Pat. No. 4,905,170 for determining the optical constants n(λ) and k(λ).

General Process for Lithographic Evaluations

To lithographically evaluate the formulation, silicon wafers were spin coated with an Underlayer composition and post apply baked (dried and cured) at 205° C. for 90 seconds resulting in a 1600 Å film thickness.

A silicon containing resist was prepared by mixing 27.67 g of a resin binder (20 wt % solution of poly{maleic anhydride-allyltrimethylsilane-tert-butylacrylate-3-(3,5,7,9,11,13,15-heptaethylpentacyclo[9.5.1.$1^{3,9}$.$1^{5,15}$.$1^{7,13}$]octa-siloxan-1-yl)propyl methacrylate} copolymer in PGMEA), 25.2 g of PAG 1 (15 wt % solution of triphenylsulfonium tris(trifluoromethylsulfonyl)methide in PGMEA), 0.33 g PAG 2 (15 wt % solution of diphenyl(2,4,6-trimethylphenyl)sulfonium perfluorooctanesulfonate in PGMEA), 7.58 g of a base (0.5 wt % solution of 1,8-diazabicyclo[5.4.0]undec-7-ene (DBU) in PGMEA), 14.9 g PGMEA and 47.0 g 2-heptanone. The resulting mixture was filtered through 0.1 μm Teflon filter. The resin binder and its synthesis procedure is described in U.S. Pat. No. 6,916,543 in Polymer Example 16. The synthesis procedure for PAG 1 is described in U.S. Pat. No. 5,554,664. PAG 2 is commercially available from Toyo Gosei.

The resist formulation from the preceding paragraph was coated over the Underlayer film, softbaked at 125° C. for 90 seconds. The coated wafers were then exposed through a 6% attenuated phase-shift reticle using an ASML/1100 scanner with a numerical aperture of 0.75 and 0.92/0.72 C-Quad Illumination to print dense trenches or dense (1:1) lines and spaces. The exposed wafers were post exposure baked at 105° C. for 90 seconds and puddle developed with a 2.38 wt % aqueous tetramethylammonium hydroxide (TMAH) solution for 30 seconds and rinsed with de-ionized water. Pattern fidelity for the target features was then examined with a Hitachi cross sectional SEM. In addition the wafers were examined top-down with the CD SEM KLA eCD2 for depth of focus (DOE) and exposure latitude (EL).

Synthesis Example 1

A mixture of the monomers was prepared by dissolving 8.3 g (37.7 mmol) [tricyclo[5,2,1,$0^{2,6}$]decylmethacrylate (TCDMA), 8.15 g (50.2 mmol) acetoxy styrene and 3.55 g (37.7 mmol) norbornene in 28.6 g of propylene glycol methyl ether acetate (PGMEA) in a 100 ml round bottom flask equipped with a reflux condenser and a gas inlet under nitrogen. After the mixture was heated to 70° C., 3.4 g of a 30 wt % solution of the free radical initiator 2,2'-azobis(2-methylbutyronitrile) in PGMEA available from Dupont under the tradename VAZO 67® was added to the reaction mixture over a period of 5 minutes. Subsequently the temperature of the mixture was increased to 80° C. and the mixture was stirred and held at 80° C. for an additional 12 hours under a nitrogen blanket. The disappearance of the monomers was monitored by GC. After the reaction mixture was cooled to room temperature, 2.0 g of a 10 wt % solution of sodium methoxide in methanol and an additional 30 ml methanol were added to the flask. The reaction mixture was refluxed for 5 hours and about 25 ml of methanol was removed by azeotropic distillation using a Dean-Stark trap. The solution was then cooled to room temperature and 10.0 g of Amberlyst 15 resin was added. After the reaction mixture was stirred for 2 hours the Amberlyst 15 resin was removed by filtration. The resulting solution was precipitated into 200 ml of heptane, the solid polymer separated by filtration and then re-dissolved in 30 ml of THF. The polymer solution in THF was re-precipitated into 500 ml of water. The solid polymer was then filtered and dried at 60° C. under vacuum for 12 hours. The yield was 65%.

Synthesis Example 2

In general the procedure from Synthesis Example 1 was followed. The starting mixture of monomers was 7.99 g (38.7 mmol) [tricyclo[5,2,1,$0^{2,6}$]decylacrylate (TCDA), 8.37 g (51.6 mmol) acetoxy styrene and 3.64 g (38.7 mmol) norbornene dissolved in 28.6 g of PGMEA. A yield of 58% was achieved.

Synthesis Example 3

A mixture of the monomers was prepared by dissolving 25.88 g (125.4 mmol) TCDA, 15.26 g (94.1 mmol) acetoxy styrene and 8.86 g (94.1 mmol) norbornene in 47 g of PGMEA in a 250 ml round bottom flask equipped with a reflux condenser and a gas inlet under nitrogen. After the mixture was heated to 70° C., 6 g of a 50 wt % solution VAZO 67® was added to the reaction mixture over a period of 5 minutes. Subsequently the temperature of the mixture was increased to 80° C. and the mixture was stirred and held at 80° C. for an additional 12 hours under a nitrogen blanket. The disappearance of the monomers was monitored by GC. After the reaction mixture was cooled to room temperature, 6.0 g of a 10 wt % solution of sodium methoxide in methanol and an additional 100 ml methanol were added to the flask. The reaction mixture was refluxed for 5 hours and about 80 ml of methanol was removed by azeotropic distillation using a Dean-Stark trap. The solution was then cooled to room temperature and 30.0 g of Amberlyst 15 resin was added. After the reaction mixture was stirred for 2 hours the Amberlyst 15 resin was removed by filtration. The resulting solution was precipitated into 600 ml of heptane, the solid polymer separated by filtration and then re-dissolved in 100 ml of THF. The polymer solution in THF was re-precipitated into 1250 ml of water. The solid polymer was then filtered and dried at 60° C. under vacuum for 12 hours. The yield was 56%.

Synthesis Example 4

In general the procedure from Synthesis Example 3 was followed. The starting mixture of monomers was 25.88 g (125.4 mmol) TCDA, 15.26 g (94.1 mmol) acetoxy styrene and 8.86 g (94.1 mmol) norbornene dissolved in 47 g of PGMEA. 6 g of a 50 wt % solution of VAZO 67® in PGMEA was added. A yield of 55% was achieved.

Synthesis Example 5

A solution of 25.88 g (125.4 mmol) TCDA, 15.26 g (94.1 mmol) acetoxy styrene (monomeric unit II producing) and 3 g of VAZO 67® (free radical initiator) in 61.71 g of PGMEA was slowly added to a solution of 8.86 g (94.1 mmol) norbornene (monomeric unit I producing) in 20.7 g of PGMEA in a 250 ml round bottom flask equipped with a reflux condenser and a gas inlet under nitrogen over a period of 3 hours at 100° C. The disappearance of the monomers was monitored by GC. After 8 hours the reaction mixture was cooled to room temperature. 6.0 g of a 10 wt % solution of sodium methoxide in methanol and an additional 100 ml methanol were added to the flask. The reaction mixture was refluxed for 5 hours and about 80 ml of methanol was removed by azeotropic distillation using a Dean-Stark trap. The solution was then cooled to room temperature and 30.0 g of Amberlyst 15 resin was added. After the reaction mixture was stirred for 2 hours the Amberlyst 15 resin was removed by filtration. The resulting solution was precipitated into 600 ml of heptane, the solid polymer separated by filtration and then re-dissolved in 100 ml of THF. The polymer solution in THF was re-precipitated into 1250 ml of water. The solid polymer was then filtered and dried at 60° C. under vacuum for 12 hours. The yield was 61%.

Synthesis Example 6

In general the procedure from Synthesis Example 5 was followed. As starting materials a solution of 28.72 g (139.2 mmol) TCDA, 12.54 g (77.3 mmol) acetoxy styrene and 3 g of VAZO 67® (free radical initiator) in 41.26 g of PGMEA and a solution of 8.74 g (92.8 mmol) norbornene in 20.4 g of PGMEA was used. The reaction temperature was 90° C. The yield was 60%.

Synthesis Example 7

In general the procedure from Synthesis Example 5 was followed. As starting materials a solution of 28.72 g (139.2 mmol) TCDA, 12.54 g (77.3 mmol) acetoxy styrene and 3 g of dimethyl-2,2'-azobis(2-methylpropionate) available from Wako Chemicals under the tradename V 601 (free radical initiator) in 41.26 g of PGMEA and a solution of 8.74 g (92.8 mmol) norbornene in 20.4 g of PGMEA was used. The reaction temperature was 80° C. The yield was 62%.

Synthesis Example 8-12

Polymers for Synthesis Examples 8-12 were commercially obtained. The synthesis procedure was similar to the procedure from Synthesis Example 7.

Synthesis Example 13

In general the procedure from Synthesis Example 5 was followed. As starting materials a solution of 9.41 g (66.1 mmol) TCDA, 8.05 g (49.6 mmol) acetoxy styrene and 1.9 g of dimethyl-2,2'-azobis(2-methylpropionate) available from Wako Chemicals under the tradename V 601 (free radical initiator) in 16.83 g of PGMEA and a solution of 7.55 g (49.6 mmol) norbornene-2-yl acetate in 13.8 g of PGMEA was used. The reaction temperature was 80° C. The yield was 48%.

Synthesis Example 14

A solution of 25.88 g (125.4 mmol) TCDA (monomeric unit III producing), 15.26 g (94.1 mmol) acetoxy styrene (monomeric unit II producing) and 3 g of VAZO 67® (free radical initiator) in 61.71 g of PGMEA is added to a solution of 15.64 g (94.1 mmol) bicyclo[2.2.1]hept-5-en-2-yl methyl acetate (NBMeAc) (monomeric unit I producing) in 20.7 g of PGMEA in a 250 ml round bottom flask equipped with a reflux condenser and a gas inlet under nitrogen over a period of 3 hours at 80° C. The disappearance of the monomers is monitored by GC. After 8 hours the reaction mixture is cooled to room temperature. A 10 wt % solution of sodium methoxide (6.0 g) in methanol and an additional 100 ml methanol is added to the flask. The reaction mixture is refluxed for 5 hours and about 80 ml of methanol is removed by azeotropic distillation using a Dean-Stark trap. The solution is then cooled to room temperature and 30.0 g of Amberlyst 15 resin is added. The reaction mixture is stirred for 2 hours then the Amberlyst 15 resin is removed by filtration. The resulting solution is precipitated into 600 ml of heptane, the solid polymer separated by filtration and then re-dissolved in 100 ml of THF. The polymer solution in THF is re-precipitated into 1250 ml of water. The solid polymer is then filtered and dried at 60° C. under vacuum for 12 hours. The dried polymer is dissolved in PGMEA to 15 wt % in order to formulate following the general formulation procedure.

Synthesis Example 15

A solution of 42.20 g (188.2 mmol) 4-biphenylacrylate (monomeric unit III producing), 10.17 g (62.7 mmol) acetoxy styrene (monomeric unit II producing) and 3 g of VAZO 67® (free radical initiator) in 61.71 g of PGMEA is slowly added to a solution of 5.90 g (62.7 mmol) norbornene (monomeric unit I producing) in 20.7 g of PGMEA in a 250 ml round bottom flask equipped with a reflux condenser and a gas inlet under nitrogen over a period of 3 hours at 80° C. The disappearance of the monomers is monitored by GC. After 8 hours the reaction mixture is cooled to room temperature. A 10 wt % solution of sodium methoxide (6.0 g) in methanol and an additional 100 ml methanol is added to the flask. The reaction mixture is refluxed for 5 hours and about 80 ml of methanol is removed by azeotropic distillation using a Dean-Stark trap. The solution is then cooled to room temperature and 30.0 g of Amberlyst 15 resin is added. The reaction mixture is stirred for 2 hours then the Amberlyst 15 resin is removed by filtration. The resulting solution is precipitated into 600 ml of heptane, the solid polymer separated by filtration and then re-dissolved in 100 ml of THF. The polymer solution in THF is re-precipitated into 1250 ml of water. The solid polymer is then filtered and dried at 60° C. under vacuum for 12 hours. The dried polymer is dissolved in PGMEA to 15 wt % in order to formulate following the general formulation procedure.

Synthesis Example 16

A solution of 43.34 g (188.2 mmol) 4-cyclohexylphenylacrylate (monomeric unit III producing), 10.17 g (62.7 mmol) acetoxy styrene (monomeric unit II producing) and 3 g of VAZO 67® (free radical initiator) in 61.71 g of PGMEA is slowly added to a solution of 5.90 g (62.7 mmol) norbornene (monomeric unit I producing) in 20.7 g of PGMEA in a 250 ml round bottom flask equipped with a reflux condenser and a gas inlet under nitrogen over a period of 3 hours at 80° C. The disappearance of the monomers is monitored by GC. After 8 hours the reaction mixture is cooled to room temperature. A 10 wt % solution of sodium methoxide (6.0 g) in methanol and an additional 100 ml methanol is added to the flask. The reaction mixture is refluxed for 5 hours and about 80 ml of methanol is removed by azeotropic distillation using a Dean-Stark trap. The solution is then cooled to room temperature and 30.0 g of Amberlyst 15 resin is added. The reaction mixture is stirred for 2 hours then the Amberlyst 15 resin is removed by filtration. The resulting solution is precipitated into 600 ml of heptane, the solid polymer separated by filtration and then re-dissolved in 100 ml of THF. The polymer solution in THF is re-precipitated into 1250 ml of water. The solid polymer would then be filtered and dried at 60° C. under vacuum for 12 hours. The dried polymer is dissolved in PGMEA to 15 wt % in order to formulate following the general formulation procedure.

Synthesis Example 17

A solution of 35.06 g (188.2 mmol) 4-cyclohexylstyrene (monomeric unit III producing), 10.17 g (62.7 mmol) acetoxy styrene (monomeric unit II producing) and 3 g of VAZO 67® (free radical initiator) in 61.71 g of PGMEA is slowly added to a solution of 5.90 g (62.7 mmol) norbornene (monomeric unit I producing) in 20.7 g of PGMEA in a 250 ml round bottom flask equipped with a reflux condenser and a gas inlet under nitrogen over a period of 3 hours at 80° C. The disappearance of the monomers is monitored by GC. After 8 hours the reaction mixture is cooled to room temperature. A 10 wt % solution of sodium methoxide (6.0 g) in methanol and an additional 100 ml methanol is added to the flask. The reaction mixture is refluxed for 5 hours and about 80 ml of methanol is removed by azeotropic distillation using a Dean-Stark trap. The solution is then cooled to room temperature and 30.0 g of Amberlyst 15 resin is added. The reaction mixture is stirred for 2 hours then the Amberlyst 15 resin is removed by filtration. The resulting solution is precipitated into 600 ml of heptane, the solid polymer separated by filtration and then re-dissolved in 100 ml of THF. The polymer solution in THF is re-precipitated into 1250 ml of water. The solid polymer is then be filtered and dried at 60° C. under vacuum for 12 hours. The dried polymer is dissolved in PGMEA to 15 wt % in order to formulate following the general formulation procedure.

Analytical results and structures for polymers from Synthesis Examples 1-17 are shown in Table 1.

TABLE 1

Synthesis Examples 1-17- Analytical results and structures

| Syn. Ex. # | Monomeric Units (Type I, II, III) | Mole Ratio | Mw | PDI | Tg (° C.) | TGA (° C.) | Solids (wt %) |
|---|---|---|---|---|---|---|---|
| SE1 | OH | 13/52/35 | 17800 | 2.06 | | | |
| SE2 | OH | 18/54/27 | 18000 | 2.54 | | | |
| SE3 | OH | 27/37/36 | 15400 | 2.76 | 133 | 310 | 100 |
| SE4 | OH | 26/36/38 | 15600 | 2.5 | 136 | 312 | |

TABLE 1-continued

| Synthesis Examples 1-17- Analytical results and structures | | | | | | | |
|---|---|---|---|---|---|---|---|
| Syn. Ex. # | Monomeric Units (Type I, II, III) | Mole Ratio | Mw | PDI | Tg (° C.) | TGA (° C.) | Solids (wt %) |
| SE5 | OH; O; O | 21/39/40 | 4000 | 1.55 | | | |
| SE6 | OH; O; O | 20/38/42 | 5800 | 1.85 | | | |
| SE7 | OH; O; O | 23/32/45 | 9800 | 1.9 | | | |
| SE8 | OH; O; O | 19/36/45 | 8100 | 1.6 | | | 17.53 |
| SE9 | OH; O; O | 27/35/38 | 8000 | 1.6 | | | 24.27 |

TABLE 1-continued

Synthesis Examples 1-17- Analytical results and structures

| Syn. Ex. # | Monomeric Units (Type I, II, III) | Mole Ratio | Mw | PDI | Tg (° C.) | TGA (° C.) | Solids (wt %) |
|---|---|---|---|---|---|---|---|
| SE10 | OH | 19/37/44 | 8400 | 1.6 | | | 38.27 |
| SE11 | OH | 29/34/36 | 10600 | 1.6 | 119 | | 36.25 |
| SE12 | OH | 24/36/40 | 8400 | 1.6 | 115 | | 35.50 |
| SE13 | OH OH | 9/53/38 | 25500 | 3.2 | | | |
| SE14 | HO OH | 10/51/39(*) | | | | | |

TABLE 1-continued

| Syn. Ex. # | Monomeric Units (Type I, II, III) | Mole Ratio | Mw | PDI | Tg (° C.) | TGA (° C.) | Solids (wt %) |
|---|---|---|---|---|---|---|---|
| Synthesis Examples 1-17- Analytical results and structures | | | | | | | |
| SE15 | OH, O, O | 25/36/39(*) | | | | | |
| SE16 | OH, O, O | 25/35/40(*) | | | | | |
| SE17 | OH | 10/40/50(*) | | | | | |

Mw: Weight average molecular weight; PDI: Polydispersivity; Tg = Glass transition temperature: TGA: Thermal decomposition measurement base on 10% weight loss.
(*)Mole ratios are estimates

Comparative Synthesis Example 1

A solution of 45.98 g (188.2 mmol) cyclohexylphenyl methacrylate, 10.17 g (62.7 mmol) acetoxy styrene, 10.55 g (62.7 mmol) cyclohexyl methacrylate and 3 g of VAZO 67® (free radical initiator) in 82.4 g of PGMEA was prepared in a 250 ml round bottom flask equipped with a reflux condenser and a gas inlet under nitrogen over a period of 3 hours at 100° C. The disappearance of the monomers was monitored by GC. After 8 hours the reaction mixture was cooled to room temperature. A 10 wt % solution of sodium methoxide (6.0 g) in methanol and an additional 100 ml methanol were added to the flask. The reaction mixture was refluxed for 5 hours and about 80 ml of methanol was removed by azeotropic distillation using a Dean-Stark trap. The solution was then cooled to room temperature and 30.0 g of Amberlyst 15 resin was added. After the reaction mixture was stirred for 2 hours the Amberlyst 15 resin was removed by filtration. The resulting solution was precipitated into 600 ml of heptane, the solid polymer separated by filtration and then re-dissolved in 100 ml of THF. The polymer solution in THF was re-precipitated into 1250 ml of water. The solid polymer was then filtered and dried at 60° C. under vacuum for 12 hours.

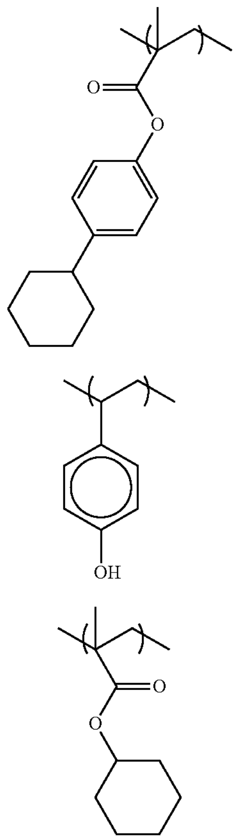

NMR results revealed a monomeric unit distribution a/b/c of 22/19/57 based on a molar ratio. The Mw of this polymer was 9900 with a PDI of 1.9. The polymer solution had a solids content of 31.9 wt %.

Formulation Example 1-13

The Underlayer compositions were prepared in an amber bottles by mixing the polymer solution in PGMEA, 16.3 wt % crosslinker solution in PGMEA, 25.4 wt % TAG solution in PGMEA and solvent. The polymer from Synthesis Example 3 was not pre-dissolved and was added in solid form. The mixtures were then rolled overnight, and the Underlayer compositions were filtered through a 0.20 μm Teflon filter. Compositions are listed in Table 2.

Formulation Example 14-19

The Underlayer compositions are prepared in an amber bottles by mixing the polymer solution in PGMEA, 16.3 wt % crosslinker solution in PGMEA, 25.4 wt % TAG solution in PGMEA and solvent. The polymer from Synthesis Example 3 is not pre-dissolved and is added in solid form. The mixtures are then rolled overnight, and the Underlayer compositions are filtered through a 0.20 μm Teflon filter. Compositions are listed in Table 2.

TABLE 2

Formulation Example Compositions

| Form. Ex. # | Polymer Solution (g) | Crosslinker (XL) Solution (g) | TAG Solution (g) | Solvent (g) | Polymer/XL/TAG (wt % of solids) |
|---|---|---|---|---|---|
| F1 | SE8 (15.09) | CLR-19-MF (2.89) | 2168E (0.06) | (PGME) 31.96 | 84.5/15/0.5 |
| F2 | SE8 (15.00) | CLR-19-MF (2.89) | 2168E (0.11) | (PGME) 32.00 | 84/15/1 |
| F3 | SE8 (14.82) | CLR-19-MF (2.89) | 2168E (0.23) | (PGME) 32.06 | 83/15/2 |
| F4 | SE8 (14.20) | CLR-19-MF (3.85) | 2168E (0.06) | (PGME) 31.89 | 79.5/20/0.5 |
| F5 | SE8 (14.11) | CLR-19-MF (3.85) | 2168E (0.11) | (PGME) 31.93 | 79/20/1 |
| F6 | SE8 (13.98) | CLR-19-MF (3.85) | 2168E (0.23) | (PGME) 31.99 | 78/20/2 |
| F7 | SE8 (16.03) | PL (0.29) | 2168E (0.11) | (PGME) 33.57 | 89.75/9.25/1 |
| F8 | SE3 (3.16) | CLR-19-MF (5.06) | 2678 (0.04) | (PGME) 41.74 | 79/20/1 |
| F9 | SE3 (3.16) | CLR-19-MF (5.06) | 2681 (0.04) | (PGME) 41.74 | 79/20/1 |
| F10 | SE3 (3.16) | CLR-19-MF (5.06) | 2690 (0.04) | (PGME) 41.74 | 79/20/1 |
| F11 | SE10 (6.87) | CLR-19-MF (2.89) | 2168E (0.11) | (PGME) 40.13 | 84/15/1 |
| F12 | SE11 (7.25) | CLR-19-MF (2.89) | 2168E (0.11) | (PGME) 39.75 | 84/15/1 |
| F13 | SE12 (7.40) | CLR-19-MF (2.89) | 2168E (0.11) | (PGME) 39.60 | 84/15/1 |
| F14 | SE14 (16.5) | CLR-19-MF (3.85) | 2168E (0.11) | (PGME) 34.33 | 79/20/1 |
| F15 | SE15 (16.5) | CLR-19-MF (3.85) | 2168E (0.11) | (PGME) 34.33 | 79/20/1 |
| F16 | SE16 (16.5) | CLR-19-MF (3.85) | 2168E (0.11) | (PGME) 34.33 | 79/20/1 |
| F17 | SE17 (16.5) | CLR-19-MF (3.85) | 2168E (0.11) | (PGME) 34.33 | 79/20/1 |
| F18 | SE13 (16.5) | PL-Pr—Me (3.85) | CXC1614 (0.11) | (PGMEA) 34.33 | 79/20/1 |
| F19 | SE3 (3.16) | PL-PH—Me (5.06) | 2181 (0.04) | (PGMEA) 41.74 | 79/20/1 |

CLR-19-MF is an alkoxymethylphenyl derivative crosslinker from Honshu Chemical Industries Co. Ltd, Japan; Powderlink 1174 (PL) is a glycoluril type crosslinkers from Cytec Industries Inc, USA; PL-Pr—Me is 7-Methyl-8-propyl-1,3,4,6-tertrakis(methoxymethyl) glycoluril and PL-Ph—Me is 7-Methyl-8-phenyl-1,3,4,6-tertrakis(methoxymethyl) glycoluril, both crosslinkers are obtained from Daychem Industries, USA; TAG 2168E, a dodecylbenzene sulfonic acid salt, K-Pure TAGs 2678, 2681, 2690, solid sulfonic acid salts, and CXC-1614, a quaternary ammonium triflate, are commercial thermal acid generator available from King Industries Inc, USA.

Formulation Example 20

A polymer solution was prepared by dissolving 2 g of polymer from Synthesis Example 13 in 22 g of PGMEA. The solution was then filtered through a 0.20 μm Teflon filter.

Comparative Formulation Example 1

The polymer solution from Comparative Synthesis Example 1 was diluted to 10% solids content with PGMEA prior to sample preparation. The underlayer composition was prepared in an amber bottle by mixing 8.22 g of the 10 wt % polymer solution in PGMEA, 2.4 g of a 15 wt % solution of CLR-19MF in PGMEA, 0.066 g K-Pure TAG 2168E solution in PGMEA, 0.21 g of 1 wt % Troysol® solution in PGMEA, and 9.11 g of PGMEA. The mixture was then rolled overnight, and the thermally curable polymer composition was filtered through a 0.20 μm Teflon filter.

Comparative Formulation Example 2

For 50 g of Underlayer composition in a 60 ml amber bottle, 1.975 g of polymer (NISSO PHS VP 9000), 3.08 g (16.26% solution in PGMEA) of CLR-19-MF cross linker, 0.10 g of TAG 2168E (25.4% solution in PGME), 44.85 g of PGMEA were mixed. The mixture was then rolled overnight, and the Underlayer composition was filtered through a 0.20 μm filter.

Comparative Formulation Example 3

For 50 g of Underlayer composition in a 60 ml amber bottle, 5.64 g of polymer solution (35.19 wt % solid, STD NOVOLAK: copolymer of m-cresol and p-cresol), 3.08 g (16.26% solution in PGMEA) of CLR-19-MF cross linker, 0.10 g of TAG 2168E (25.4% solution in PGME), 41.17 g of PGMEA were mixed. The mixture was then rolled overnight, and the Underlayer composition was filtered through a 0.20 μm filter.

Examples 1-14

193 nm Lithographic Evaluation of Underlayer Compositions

Formulation Examples F1-F13 were processed according to the General Process for Lithographic Evaluations. Additionally, formulations F11-F14 were processed according to General Procedure for Measurement of Optical Constants n and k. Results are listed in Table 3 below.

Coating film thicknesses of the silicon containing resist for examples evaluated for dense (1:1) trenches was 130 nm while all examples evaluated for dense (1:1) lines and spaces (Us) were coated to a target thickness of 170 nm. The exposing energies necessary to size the target feature were between 28.6 and 33.5.

TABLE 3

Summary of lithographic and optical measurement results for Examples 1-14

| Ex. | Form. | Refractive Index at 193 nm | | Target Feature size | Res. | DOF | EL | Profile |
|---|---|---|---|---|---|---|---|---|
| # | Ex. # | n | k | nm | nm | μm | % | Integrity |
| 1 | F1 | — | — | 110 nm dense trenches | 105 | 0.75 | 17.9 | vertical, slightly rounded |
| 2 | F2 | — | — | 110 nm dense trenches | 100 | 1.2 | 17.9 | vertical, rounded, slight footing |
| 3 | F3 | — | — | 110 dense trenches | 105 | 1.05 | 17.9 | vertical, rounded, slight footing |
| 4 | F4 | — | — | 110 dense trenches | 105 | 1.2 | 19.4 | vertical, slightly rounded |
| 5 | F5 | — | — | 110 dense trenches | 105 | 1.05 | 17.9 | vertical, rounded, slight footing |
| 6 | F6 | — | — | 110 dense trenches | 105 | 1.2 | 17.9 | vertical, rounded, slight footing |
| 7 | F7 | — | — | 110 dense trenches | NA | NA | 9.4 | sloped, footing |
| 8 | F8 | — | — | 110 dense l/s | 105 | 0.75 | 13.2 | rounded, vertical, clean |

TABLE 3-continued

Summary of lithographic and optical measurement results for Examples 1-14

| Ex. | Form. | Refractive Index at 193 nm | | Target Feature size | Res. | DOF | EL | Profile |
|---|---|---|---|---|---|---|---|---|
| # | Ex. # | n | k | nm | nm | μm | % | Integrity |
| 9 | F9 | — | — | 110 dense l/s | 105 | 0.9 | 9.2 | rounded, vertical profile, clean |
| 10 | F10 | — | — | 110 dense l/s | 105 | 0.15 | 6.0 | rounded, vertical, clean |
| 11 | F11 | 1.573 | 0.418 | 80 dense trenches | 75 | 0.6 | 14.5 | rounded, vertical, clean |
| 12 | F12 | 1.623 | 0.381 | 80 dense trenches | 75 | 0.7 | 18.1 | rounded, vertical, clean |
| 13 | F13 | 1.603 | 0.389 | 80 dense trenches | 75 | 0.8 | 17.2 | rounded, vertical, clean |
| 14 | F20 | 1.670 | 0.182 | — | — | — | — | — |

DOF and EL were measured for +/−10% of target CD
Res = Resolution, smallest open feature The results in Table 3 show that the Underlayer compositions can be successfully used as underlayers in bilayer resist systems. Various TAGs and crosslinkers have been used at varying levels resulting in good lithography in silicon containing resist coatings.

Examples 15-17

193 nm Lithographic Evaluation of Underlayer Compositions

Formulation Examples 14, 18 and 19 are processed according to the General Process for Lithographic Evaluations. Coating film thicknesses of the silicon containing resist for dense (1:1) trenches is 130 nm.

Pattern fidelity for the target features is examined with a Hitachi cross sectional SEM. The resulting SEM images show clean trenches, slightly rounded tops with vertical sidewalls.

Examples 18-20

248 nm Lithographic Evaluation of Underlayer Compositions

Formulation Examples 15, 16 and 17 are coated onto silicon wafers and post apply baked at 205° C. for 90 seconds resulting in 500 nm thick Underlayer films. The silicon containing resist (TIS 2000, a chemically amplified resist available from FUJIFILM Electronic Materials U.S.A., Inc.) is then spin coated over the Underlayer films and baked at 135° C. for 60 seconds to yield 250 nm thick films. The bilayer coated wafers are then patternwise exposed using a Cannon EX6 Stepper (0.65 NA, 5/8 annular with a binary reticle). The wafers are post exposure baked at 125 C.° for 60 seconds and puddle developed for 60 seconds in 0.262 N aqueous TMAH. The wafers are rinsed with DI water and spun dry. The resulting resist patterns are then analyzed by scanning electron microscopy (SEM).

The patterned resist films show good resolution. The sidewalls of 140 nm 1:1 trenches are vertical. No footing or t-topping is observed.

Example 21 and Comparative Example 1

Oxide Etch

The Underlayer composition was spin coated onto an 8-inch silicon wafer, cured at 205° C. for 90 seconds on a hotplate to obtain a 160 nm thick Underlayer film. The Underlayer film was then etched for 5 seconds using an oxide etch apparatus by LAM with a gas mixture feed of $O_2/SO_2/CH_3F$ at a ratio of 150/250/5 sccm and a pressure of 170 mT. The etch rate was determined by measuring the before and after etch UL film thicknesses. These thickness measurements were performed on a scanning-type electron microscope.

$$\frac{UnderlayerThicknessBeforeEtch[\text{nm}] - UnderlayerThicknessAfterEtch[\text{nm}]}{\text{Time[s]}} = EtchRate\left[\frac{\text{nm}}{\text{s}}\right]$$

TABLE 4

Blanket Oxid Etch Data of Underlayer Formulation

| Example #. | Formulation # | Film Thickness Loss(nm) | Plasma etch Rate (nm/sec) |
|---|---|---|---|
| Comparative 1 | Comparative 1 | 122.2 | 24.5 |
| 21 | F10 | 99.00 | 19.8 |

The etch rate of the Underlayer film with a cycloolefinic monomer containing polymer (Example 21) is about 24% lower than the etch rate of Comparative Example 1.

Example 22 and Comparative Example 2-3

W Etch Resistance

The Underlayer composition was coated on a 6-inch silicon wafer utilizing a spin coater, post apply baked at 205° C. for 90 seconds on a hotplate to obtain an Underlayer film. The Underlayer film was etched using a W etcher (SF6/N2) by LAM with a Chamber pressure of 5 mTorr, RF Power of 500 W, bias voltage of 50 V, SF6 flow of 70 sccm and N2 flow of 30 sccm. Etch time was 30 seconds. Before and after etch Underlayer film thickness measurements were done using the n&k analyzer. Bulk etch rates were calculated as follows:

$$\frac{UnderlayerThicknessBeforeEtch[\text{nm}] - UnderlayerThicknessAfterEtch[\text{nm}]}{\text{Time[min]}} = EtchRate\left[\frac{\text{nm}}{\text{min}}\right]$$

Optical parameters were measured as described in General Procedure for Measurement of Optical Constants n and k. Table 5 lists W etch rates and optical parameters for Underlayer film Compositions.

TABLE 5

W Etch rates and n&k Constants

| | Formulation Example | Etch rate (nm/min) | n | k |
|---|---|---|---|---|
| Example 22 | F11 | 178 | 1.573 | 0.418 |
| Comparative Example 2 | Comparative 2 | 166 | 1.567 | 0.946 |
| Comparative Example 3 | Comparative 3 | 155 | 1.57 | 0.77 |

Example 22 shows that the Underlayer film prepared from the Underlayer composition of the present disclosure had etch rates similar to that of novolak or hydroxystyrene polymer systems and at the same time had superior optical properties (n and k) at a wavelength of 193 nm.

While the disclosure has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

We claim:

1. An etch resistant thermally curable underlayer composition for use in a multilayer lithographic process, the composition comprising:

(a) a polymer comprising repeating units of Structures I, II and III, the polymer comprising about 10 to about 35 mol % of Structure I, about 10 to about 55 mol % of Structure II, and about 25 to about 60 mol % of Structure III,

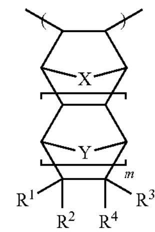

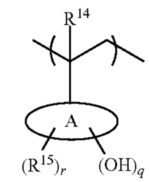

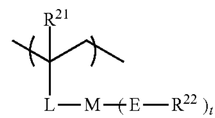

wherein $R^1$, $R^2$, $R^3$ and $R^4$ individually are selected from the group consisting of a hydrogen atom, a halogen atom, a linear, branched or cyclic $C_1$-$C_{10}$ alkyl group, a $C_6$-$C_{20}$ aryl group, a halogenated or partially halogenated linear, branched or cyclic $C_1$-$C_{10}$ alkyl group, and a polar group represented by $(CH_2)_nR^5$, with the proviso that $R^2$ and $R^4$ may be bonded to each other to form a bivalent group selected from the group consisting of —C(O)—Z—C(O)— and $—(CH_2)_pOC(O)—$, wherein Z is selected from the group consisting of —O— and —N($R^{13}$)—, p is an integer from 1 to about 3 and $R^{13}$ is selected from the group consisting of a hydrogen atom and a $C_1$-$C_{10}$ alkyl group; $R^5$ is selected from the group consisting of —O$R^6$, —(O$R^{12}$)$_o$O$R^7$, —C(O)O$R^8$, —C(O)(O$R^{12}$)$_o$O$R^9$ or —OC(O)$R^{10}$ and n is an integer from 0 to 5; wherein $R^6$, $R^7$, $R^8$, $R^9$ and $R^{10}$ each independently are selected from the group consisting of a hydrogen atom, a substituted or unsubstituted linear, branched or cyclic $C_1$-$C_{20}$ alkyl group, and a substituted or unsubstituted $C_6$-$C_{20}$ aryl group; $R^{12}$ is a $C_2$-$C_6$ linear, branched or cyclic alkylene group; o is an integer from 1 to about 5; m is an integer from 0 to about 4; and X and Y are independently selected from the group consisting of —$CH_2$—, —O—, and —S—; $R^{14}$ is selected from the group consisting of a hydrogen atom, a $C_1$-$C_3$ alkyl group, a fully or partially halogen substituted $C_1$-$C_3$ alkyl group, and a halogen atom; A is selected from the group consisting of a $C_6$-$C_{20}$ arylene group and a $A^1$-W-$A^2$ group wherein $A^1$ is a $C_6$-$C_{10}$ arylene group, $A^2$ is a $C_6$-$C_{10}$ aryl group and W is selected from the group consisting of a single bond, —S—, —O—, —C(O)—, —C(O)O—, —C($R^{16}R^{17}$)—, —C(=C$R^{18}R^{19}$)— and —C$R^{18}$=C$R^{19}$—, wherein $R^{16}$, $R^{17}$, $R^{18}$ and $R^{19}$ are independently selected from the group consisting of a hydrogen atom, a halogen atom, a cyano group, a $C_1$-$C_{10}$ alkyl group, and a partial or completely halogen substituted $C_1$-$C_{10}$ alkyl group; $R^{15}$ is selected from the group consisting of a halogen atom, a linear, branched or cyclic $C_1$-$C_{10}$ alkyl group, and a partial or complete halogen substituted $C_1$-$C_{10}$ alkyl group; q is an integer from 1 to 2; and r is an integer from 0 to about 3; $R^{21}$ is selected from the group consisting of a hydrogen atom, a $C_1$-$C_3$ alkyl group, and a halogen atom; L is selected from the group consisting of a single bond, a —C(O)O—, —C(O)O($R^{23}$O)$_s$—, and a —C(O)N$R^{24}$— group, wherein $R^{23}$ is a $C_2$-$C_6$ alkylene group; $R^{24}$ is selected from the group consisting of a hydrogen atom and a linear, branched or cyclic $C_1$-$C_{10}$ alkyl group; s is an integer from 1 to about 4; M is selected from the group consisting of a $C_5$-$C_{20}$ cycloalkylene group and a $C_6$-$C_{18}$ arylene group; E is selected from the group consisting of a single bond, —O—, —C(O)O—, —C(O)—, and —S($O_2$)—; $R^{22}$ is selected from the group consisting of a hydrogen atom, a substituted or unsubstituted linear, branched or cyclic $C_1$-$C_{10}$ alkyl group, alicyclic $C_5$-$C_{15}$ hydrocarbon group, a $C_6$-$C_{18}$ aryl group, and a $C_7$-$C_{18}$ alkylaryl group and t is an integer from 1 to about 4; with the proviso that when L is a single bond and M is an arylene group E-$R^{22}$ is not —OH; and with the proviso that none of the repeating units of Structure I or II or III contain acid sensitive groups;

(b) at least one crosslinking agent;

(c) at least one thermal acid generator; and (d) at least one solvent.

2. An etch resistant thermally curable underlayer composition according to claim 1 wherein the polymer comprises repeating units of Structures Ia, IIa and IIIa-1

Ia

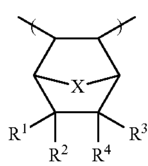

-continued

IIa

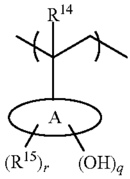

IIIa-1

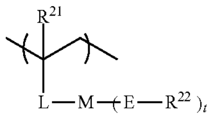

wherein $R^1$, $R^2$, $R^3$, $R^4$, and X are as defined for Structure I; $R^{14}$, $R^{15}$, r and q are as defined for Structure II; A is selected from the group consisting of a naphthyl and a phenyl group; M is a $C_6$-$C_{18}$ arylene group, $R^{21}$ is as defined for Structure III; L is selected from the group consisting of a single bond and —C(O)O—; E is selected from the group consisting of a single bond, —O— and —C(O)O—; $R^{22}$ is selected from the group consisting of a hydrogen atom, a substituted or unsubstituted linear branched or cyclic $C_1$-$C_{10}$ alkyl group and a substituted or unsubstituted alicyclic $C_5$-$C_{15}$ group; and t is an integer from 1 to about 3; with the proviso that when L is a single bond E-$R^{22}$ is not —OH; and with the proviso that none of the repeating units of Structure Ia or IIa or IIIa-1 contain acid sensitive groups.

3. An etch resistant thermally curable underlayer composition according to claim 1 wherein the polymer comprises repeating units of Structures Ia, IIa and IIIa-2

Ia

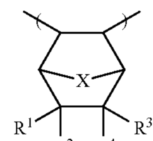

IIa

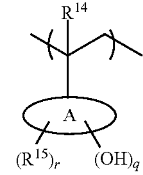

IIa-2

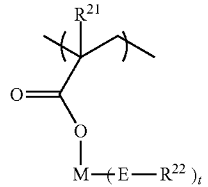

$R^1$, $R^2$, $R^3$, $R^4$, and X are as defined for Structure I; $R^{14}$, $R^{15}$, r and q are as defined for Structure II, A is selected from the group consisting of a naphthyl or phenyl group; M is a $C_5$-$C_{20}$ cycloalkylene group, $R^{21}$ is as defined for Structure III, E is selected from the group consisting of a single bond, —O— and —C(O)O—; $R^{22}$ is selected from the group consisting of a hydrogen atom, a substituted or unsubstituted linear branched or cyclic $C_1$-$C_{10}$ alkyl group, and a substituted or unsubstituted alicyclic $C_5$-$C_{15}$ group; and t is an integer from 1 to about 3; with the proviso that none of the repeating units of Structure Ia or IIa or IIIa-2 contain acid sensitive groups.

4. An etch resistant thermally curable underlayer composition according to claim 1 wherein the polymer comprises repeating units of Structures Ib, IIb and IIIb-1

Ib

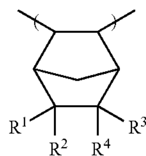

IIb

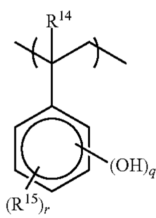

IIIb-1

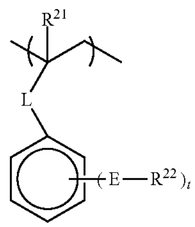

wherein $R^1$, $R^2$, $R^3$ and $R^4$ individually are selected from the group consisting of a hydrogen atom, a halogen atom, a linear, branched or cyclic $C_1$-$C_{10}$ alkyl group, a halogenated or partially halogenated linear, branched or cyclic $C_1$-$C_{10}$ alkyl group, and a polar group $(CH_2)_nR^5$ wherein $R^5$ is selected from the group consisting of —$OR^6$, —$C(O)OR^8$, —$C(O)(OR^{12})_oOR^9$ or —$OC(O)R^{10}$ and n is an integer from 0 to 2; $R^6$, $R^8$, $R^9$ and $R^{10}$ are individually selected from the group consisting of a hydrogen atom, a substituted or unsubstituted linear, branched or cyclic $C_1$-$C_{20}$ alkyl group and a substituted or unsubstituted $C_6$-$C_{20}$ aryl group; $R^{12}$ is a $C_2$-$C_6$ linear, branched or cyclic alkylene group; o is an integer from 1 to about 5; $R^{14}$, r and q are as defined for Structure II; $R^{15}$ is selected from the group consisting of a halogen atom, a linear, branched or cyclic $C_1$-$C_4$ alkyl group, and a partial or complete halogen substituted $C_1$-$C_4$ alkyl group; $R^{21}$ is defined as in Structure III; L is selected from the group consisting of a single bond and —C(O)O—; E is selected from the group consisting of a single bond and oxygen atom; $R^{22}$ is selected from the group consisting of a hydrogen atom, a substituted or unsubstituted linear branched or cyclic $C_1$-$C_{10}$ alkyl group, and a substituted or unsubstituted alicyclic $C_5$-$C_{15}$ group; and t is an integer from 1 to about 2; with the proviso that when L is a single bond -E-$R^{22}$ is not —OH and with the proviso that none of the repeating units of Structure Ib or IIb or IIIb-1 contain acid sensitive groups.

5. An etch resistant thermally curable underlayer composition according to claim 1 wherein the polymer comprises repeating units of Structures Ib, IIb and IIIb-2, Ib

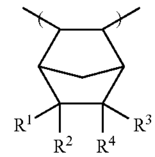

IIb

IIIb-2 wherein $R^1$, $R^2$, $R^3$ and $R^4$ individually are selected from the group consisting of a hydrogen atom, a halogen atom, a linear, branched or cyclic $C_1$-$C_{10}$ alkyl group, a halogenated or partially halogenated linear, branched or cyclic $C_1$-$C_{10}$ alkyl group, and a polar group $(CH_2)_nR^5$ wherein $R^5$ is selected from the group consisting of —$OR^6$, —$C(O)OR^8$, —$C(O)(OR^{12})_oOR^9$ and —$OC(O)R^{10}$; n is an integer from 0 to 2; $R^6$, $R^8$, $R^9$ and $R^{10}$ are individually selected from the group consisting of a hydrogen atom, a substituted or unsubstituted linear, branched or cyclic $C_1$-$C_{20}$ alkyl group and a substituted or unsubstituted $C_6$-$C_{20}$ aryl group; $R^{12}$ is a $C_2$-$C_6$ linear, branched or cyclic alkylene group; o is an integer from 1 to about 5; $R^{14}$, r and q are as defined for Structure II; $R^{15}$ is selected from the group consisting of a halogen atom, a linear, branched or cyclic $C_1$-$C_4$ alkyl group, and a partial or complete halogen substituted $C_1$-$C_4$ alkyl group; $R^{21}$ is as defined for Structure III, E is selected from the group consisting of a single bond and an oxygen atom; $R^{22}$ is selected from the group consisting of a hydrogen atom, a substituted or unsubstituted, linear, branched or cyclic $C_1$-$C_6$ alkyl group, and a substituted or unsubstituted alicyclic $C_5$-$C_{15}$ group; and t is an integer from 1 to about 2; M is a $C_5$-$C_{20}$ cycloalkylene group; and with the proviso that none of the repeating units of Structure Ib or IIb or IIIb-2 contain acid sensitive groups.

6. An etch resistant thermally curable underlayer composition according to claim 1 wherein the polymer comprises repeating units of Structures Ic, IIc and IIIc, Ic

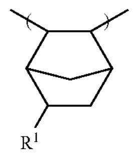

-continued

IIc

IIIc

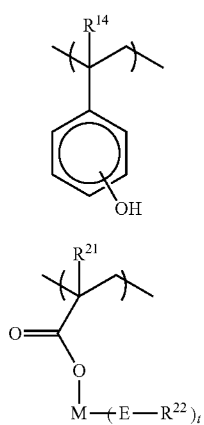

wherein $R^1$ is selected from the group consisting of a hydrogen atom, a halogen atom, a linear, branched or cyclic $C_1$-$C_6$ alkyl group, a halogenated or partially halogenated linear, branched or cyclic $C_1$-$C_6$ alkyl group, and a polar group $(CH_2)_nR^5$ wherein $R^5$ is —OC(O)$R^{10}$, wherein $R^{10}$ is a substituted or unsubstituted linear, branched or cyclic $C_1$-$C_6$ alkyl group, n is an integer of 0 or 1; $R^{14}$ is selected from the group consisting of a hydrogen atom and a methyl group; M is a $C_5$-$C_{20}$ cycloalkylene group, $R^{21}$ is selected from the group consisting of a hydrogen atom and a methyl group, E is selected from the group consisting of a single bond and oxygen atom; $R^{22}$ is selected from the group consisting of a hydrogen atom, a substituted or unsubstituted linear branched or cyclic $C_1$-$C_6$ alkyl group, and a substituted or unsubstituted alicyclic $C_5$-$C_{15}$ group; and t is an integer from 1 to about 2; and with the proviso that none of the repeating units of Structure Ic or IIc or IIIc contain acid sensitive groups.

7. An etch resistant thermally curable underlayer composition according to claim 1 wherein the repeating units of Structures I, II and III are generated from the monomers norbornene, acetoxy styrene and tricyclo[5,2,1,$0^{2,6}$]decylmethacrylate.

8. An etch resistant thermally curable underlayer composition according to claim 1 wherein the repeating units of Structures I, II and III are generated from the monomers norbornene, acetoxy styrene and tricyclo[5,2,1,$0^{2,6}$]decylacrylate.

9. An etch resistant thermally curable underlayer composition according to claim 1, the polymer consisting of repeating units of Structures I, II and III.

* * * * *